(12) United States Patent
Abe et al.

(10) Patent No.: US 8,274,845 B2
(45) Date of Patent: Sep. 25, 2012

(54) NONVOLATILE SEMICONDUCTOR MEMORY DEVICE

(75) Inventors: Katsumi Abe, Kanagawa-ken (JP); Masahiro Yoshihara, Kanagawa-ken (JP); Masaru Koyanagi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 314 days.

(21) Appl. No.: 12/793,062

(22) Filed: Jun. 3, 2010

(65) Prior Publication Data
US 2010/0309733 A1    Dec. 9, 2010

(30) Foreign Application Priority Data

Jun. 3, 2009    (JP) ................................. 2009-134349

(51) Int. Cl.
*G11C 7/00* (2006.01)
*G11C 16/00* (2006.01)

(52) U.S. Cl. ......... 365/189.05; 365/185.21; 365/185.24; 365/189.12

(58) Field of Classification Search .............. 365/189.12
See application file for complete search history.

(56) References Cited

U.S. PATENT DOCUMENTS

| | | | | |
|---|---|---|---|---|
| 5,537,356 A | * | 7/1996 | Akaogi et al. | ................. 365/205 |
| 5,790,459 A | * | 8/1998 | Roohparvar | ............. 365/185.21 |
| 2008/0001656 A1 | | 1/2008 | Takeuchi | |

FOREIGN PATENT DOCUMENTS

JP    2008-11446    1/2008

* cited by examiner

*Primary Examiner* — Tan T. Nguyen
(74) *Attorney, Agent, or Firm* — Oblon, Spivak, McClelland, Maier & Neustadt, L.L.P.

(57) ABSTRACT

A nonvolatile semiconductor memory device is provided, which includes an input buffer provided with a first inverter that can electrically adjust circuit threshold values, a circuit threshold value monitor provided with a second inverter having the same circuit configuration as the first inverter to detect the circuit threshold values of the first inverter when the input and output of the second inverter are short-circuited, respectively, a memory storing parameter values that correspond to the circuit threshold values detected by the circuit threshold value monitor, and a data-reader circuit reading the parameter values given to the first inverter from the memory.

9 Claims, 24 Drawing Sheets

(a)

(b)

NONVOLATILE SEMICONDUCTOR MEMORY DEVICE

CROSS-REFERENCE TO RELATED APPLICATION

This application is based upon and claims the benefit of priority from the prior Japanese Patent Application No. 2010-134349, filed on Jun. 3, 2010, the entire contents of which are incorporated herein by reference.

BACKGROUND OF THE INVENTION

The present invention relates to a nonvolatile semiconductor memory device.

In a nonvolatile semiconductor memory device, an input buffer is arranged in order to amplify a control signal or a data signal input from the outside to "0"/"1" of a CMOS level. For example, as a configuration of an input buffer of a NAND flash memory and so on, a circuit configuration having an inverter may be adopted.

The input buffer corrects circuit threshold value voltages by determining a β ratio of a PMOS transistor and an NMOS transistor provided in an inverter, for example, through connection/disconnection of an interconnection layer mask. Here, the β ratio is defined as a ratio of channel widths W of the PMOS transistor and the NMOS transistor.

However, the adjustment of the β ratio is limited in the configuration of the input buffer or a method of correcting its circuit threshold value, and thus it cannot cope with individual primary factors, such as differences in the threshold value of transistors for respective chips, the change of a power supply voltage in use, and the like. Due to this, duty error of the input buffer is increased.

Here, the duty error is defined as a deviation (difference) between an input duty ratio and an output duty ratio. The duty ratio is defined as a time ratio of an "H"-level signal period and an "L"-level signal period.

If the duty error of the input buffer is increased, setup/hole margin deterioration or a difference in output data window occurs, and thus a high-speed data input/output cannot be achieved. Accordingly, the performance of a nonvolatile semiconductor memory device may deteriorate greatly.

BRIEF SUMMARY OF THE INVENTION

According to an aspect of the present invention, a nonvolatile semiconductor memory device is obtained, which can reduce the duty error and is advantageous in high-speed data input/output. According to an aspect of the embodiment, A nonvolatile semiconductor memory device comprising, an input buffer provided with a first inverter that can electrically adjust: circuit threshold values, a circuit threshold value monitor provided with a second inverter having the same circuit configuration as the first inverter to detect the circuit threshold values of the first inverter when input and output of the second inverter are short-circuited, respectively, a memory storing parameter values that correspond to the circuit threshold values detected by the circuit threshold value monitor; and a data-reader circuit reading the parameter values given to the first inverter from the memory.

DETAILED DESCRIPTION OF THE INVENTION

Embodiment

Figure 1:
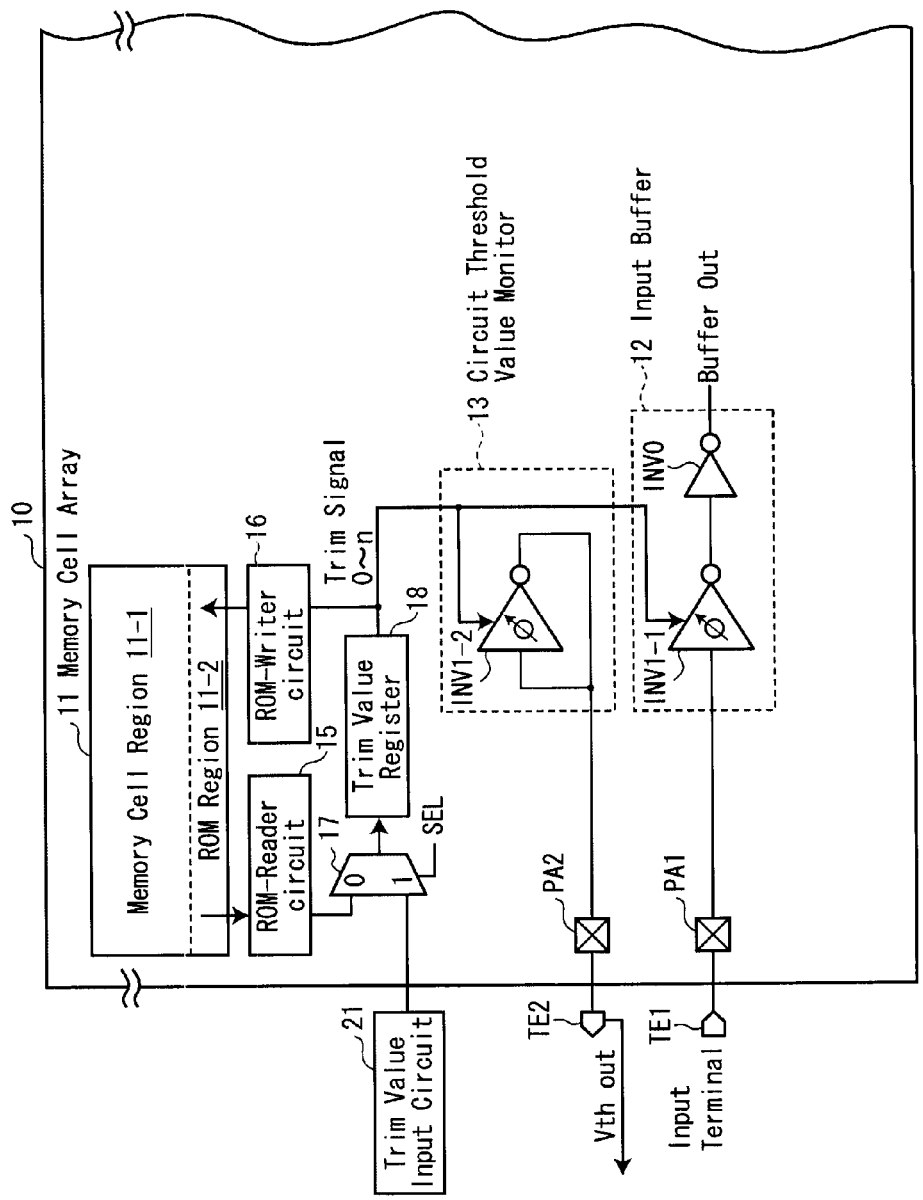
FIG. 1 is a block diagram illustrating a whole configuration example of a nonvolatile semiconductor memory device according to a first embodiment of the invention.

Hereinafter, preferred embodiments of the present invention will be described in detail with reference to the accompanying drawings. In the following description, a NAND flash memory is exemplified as a nonvolatile semiconductor memory device, but the nonvolatile semiconductor memory device is not limited thereto.

In the following description, common reference numerals are given to common constituent elements across whole figures.

First, referring to FIG. 1, a summary of a nonvolatile semiconductor memory device according to a first embodiment of the invention will be described. As illustrated, as an inverter that constitutes an input buffer 12, an inverter (first inverter) INV1-1 having a function (trim function) of electrically adjusting the ratio of gate widths W of a PMOS transistor and an NMOS transistor is provided. Further, a trim value is input from the outside of the device so that a circuit threshold value voltage, which is generated by a circuit threshold value monitor 13 that is provided with the first inverter INV1-1 and an inverter (second inverter) INV1-2 having the same circuit configuration as that of the first inverter, becomes ½ of a power supply voltage.

A confirmed trim value (parameter value: Trim0 to Trimn) is stored in a ROM region 11-2 inside a memory cell array 11. Further, by reading and providing the value to the first inverter INV1-1 of the input buffer 12 before the device (chip) 10 is actually used through an input of power supply thereto, the β ratio of the input buffer 12 is optimally adjusted.

As described above, a nonvolatile semiconductor memory device, which can reduce the duty error of the input buffer 12 and is advantageous in high-speed data input/output, is proposed.

Next, with reference to FIGS. 1 to 7, a nonvolatile semiconductor memory device according to a first embodiment of the present invention will be described in detail.

1. First Embodiment 1-1. The Whole Configuration Example

First, with reference to FIG. 1, the whole configuration example of a nonvolatile semiconductor memory device according to a first embodiment of the present invention will be described in detail.

As illustrated, the nonvolatile semiconductor memory device according to this embodiment includes a memory cell array 11, an input buffer 12, a circuit threshold value monitor 13, a ROM-reader circuit 15, a ROM-writer circuit 16, a selector 17, a trim value register 18, and pads PA1 and PA2. Also, on the outside of the device, a trim value input circuit 21 and terminals TE1 and TE2 are arranged.

The memory cell array 11 is provided with a memory cell region 11-1 and a ROM region 11-2, each of which has a plurality of memory cells arranged in the form of a matrix on a cross position of word lines and bit lines.

In the memory cell region 11-1, for example, general data such as user data and so on are stored. The ROM region 11-2 is a special cell region that is called a ROM block arranged inside the memory cell array 11 in which management data and so on are stored. Further, in this embodiment, a trim value (parameter value: Trim0 to Trimn) when the circuit threshold value of the first inverter INV1-1 coincides with (corresponds to) the circuit threshold value detected by the circuit threshold value monitor 13 is stored in the ROM region 11-2. The trim value (parameter value: Trim0 to Trimn) stored in the ROM region 11-2, to be described later, is read by the ROM-reader circuit 15, and is given to the first inverter INV1-1 of the input buffer 12. In this case, a memory that stores the trim value (parameter value: Trim0 to Trimn) is not limited to the ROM region 11-2 in this embodiment. For example, a fuse and the like, which are arranged in a region that is not the memory cell array 11, may be adopted instead.

The input buffer 12 is provided with the inverter (first inverter) INV1-1 and an inverter INV0.

The first inverter INV1-1 is so configured that the circuit threshold value can be electrically adjusted by the given trim value (parameter value: Trim0 to Trimn). The input of the first inverter INV1-1 is connected to the input terminal TE1 on the outside of the device through the pad PA1, and the output thereof is connected to the input of the inverter INV0 to receive the given trim value (parameter value: Trim0 to Trimn). The inverter INV0 inverts the output of the first inverter INV1-1, and outputs the inverted output as a buffer output Buffout of the input buffer 12. The buffer output Buffout of the input buffer 12, for example, is given to a control circuit (sequencer) (not illustrated) and so on of the nonvolatile semiconductor memory device, and is used during the data input/output operation of the memory cell array 11.

The circuit threshold value monitor 13 is provided with an inverter (a second inverter) INV1-2 having the same circuit configuration as the first inverter INV1-1, and detects the circuit threshold value of the first inverter INV1-1 when the input and the output of the second inverter INV1-2 are short-circuited, respectively. More specifically, due to the given trim value (parameter value: Trim0 to Trimn), the second inverter INV1-2 outputs the short-circuit input and output to the outside of the device through the pad PA2 and the terminal TE2 as the circuit threshold value voltage Vthout.

The ROM-reader circuit 15 reads the trim value (parameter value: Trim0 to Trimn) stored in the ROM region 11-2, and outputs the read trim value to an input terminal "0" of the selector 17.

The ROM-writer circuit 16 writes the confirmed trim value (parameter value: Trim0 to Trimn) output from the trim value register 18 in the ROM region 11-2.

One input "0" of the selector 17 is connected to the output of the ROM-reader circuit 15, and the other input "1" thereof is connected to the output of the trim value input circuit 21 installed on the outside of the device. Either of the inputs is switched and output to the trim value register 18 by a selection signal SEL that is provided from a control circuit (not illustrated) such as a memory controller and so on.

The trim value register (storage circuit) 18 outputs the output of the selector 17 to the ROM-writer circuit 16, the first inverter INV1-1 of the input buffer 12, and the second inverter INV1-2 of the circuit threshold value monitor 13 as the trim value (parameter value: Trim0 to Trimn). As described above, the output of the selector 17 is input to the trim value register 18, and the output (trim value) of the trim value register 18 is given to the ROM region 11-2 through the ROM-writer circuit 16, to the input buffer 12 composed of the first and second inverters INV1-1 and INV1-2 having the trim function, and to the circuit threshold value monitor 13, respectively. The pads PA1 and PA2 are electrically connected to the external terminals TE1 and TE2.

1-2. Configuration Example of First and Second Inverters INV1-1 and INV1-2

Next, the configuration example of the first and second inverters INV1-1 and INV1-2 having the trim function according to this embodiment will be described.

1-2-1. NMOS Adjustment Method

Figure 2:
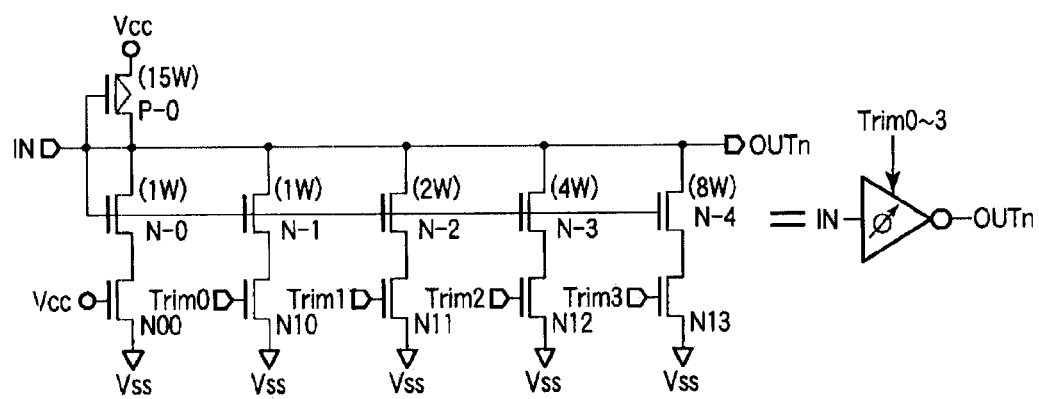
FIG. 2 is an equivalent circuit diagram illustrating a configuration example of an inverter according to the first embodiment of the invention.

Referring to FIG. 2, the configuration example of the first and second inverters INV1-1 and INV1-2 regarding the NMOS adjustment method will be described. The first or second inverter INV1-1 or INV1-2 includes a PMOS transistor P-0 of which the gate width W is fixed to 15 W, five NMOS transistors N-0 to N-4 of which the gate width is divided into 1 W, 1 W, 2 W, 4 W, and 8 W, respectively, and switch NMOS transistors N00 to N13 inserted in series into the NMOS transistors N-0 to N-4, respectively.

An internal power supply voltage Vcc is given to a source of the PMOS transistor P-0, an input signal IN is given to its gate, and its drain is connected to an output terminal OUTn.

Sources of the NMOS transistors N-0 to N-4 are connected to drains of the NMOS transistors N10 to N13, respectively, their drains are connected to the output terminal OUTn, and their gates receive the input signal IN, respectively.

Since the internal power supply voltage Vcc is given to the gate of the first switch NMOS transistor N00, the NMOS transistor N00 is constantly turned on. In this case, the gate width 1 W of the first NMOS transistor N00, which is constantly turned on, is to secure the lowest width 1 W of the NMOS transistor when the trim signal is "0".

On the other hand, four-bit trim signals Trim0 to Trim3 are input to gates of the other four switch NMOS transistors N10 to N13, respectively. A ground power supply voltage Vss is given to sources of the NMOS transistors N10 to N13.

According to the above-described configuration, since the switch NMOS transistors N10 to N13 are turned on/off according to the values of the input trim signals Trim0 to Trim3, the gate width values W of the NMOS transistors N-0 to N-4 with respect to the PMOS transistor P-0 can be selectively changed from 1 W to 16 W.

1-2-2. NMOS/PMOS Adjustment Method

Figure 3:
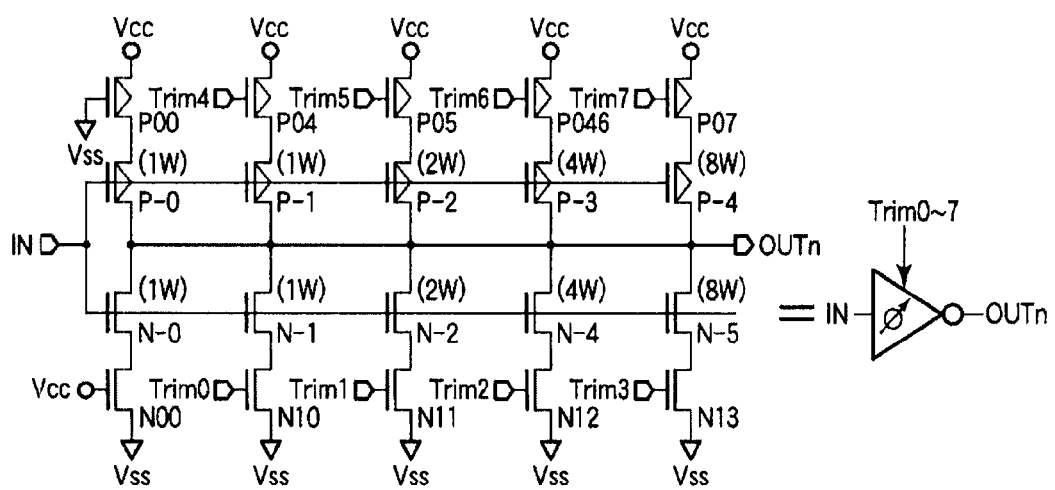
FIG. 3 is an equivalent circuit diagram illustrating a configuration example of an inverter according to the first embodiment of the invention.
Figure 4:
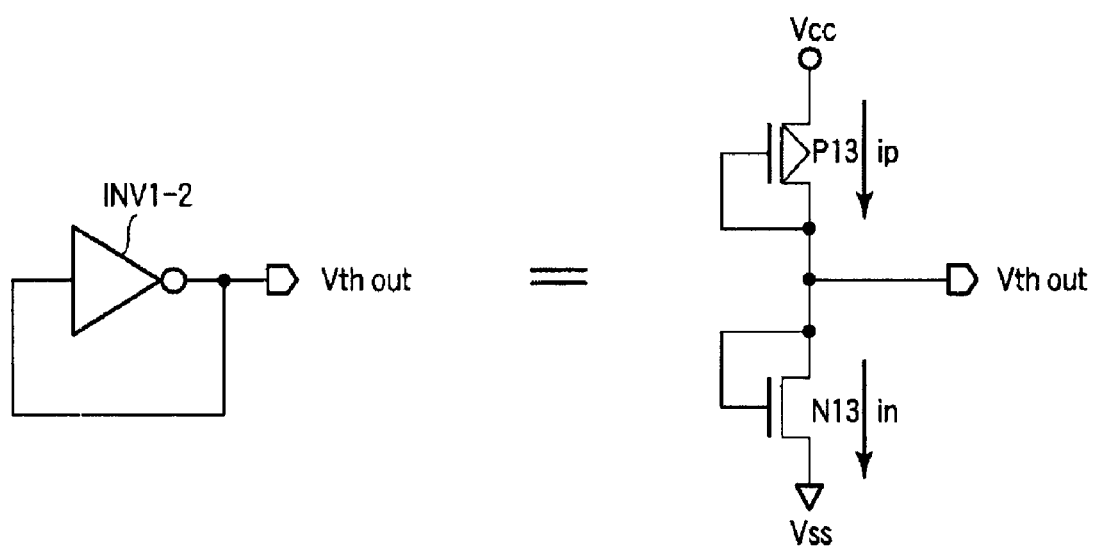
FIG. 4 is an equivalent circuit diagram schematically illustrating a configuration example of a circuit threshold value monitor according to the first embodiment of the invention.

Referring to FIG. 3, the configuration example of the first and second inverters INV1-1 and INV1-2 regarding the NMOS/PMOS adjustment method will be described. In this configuration, since the gate width W of the PMOS transistors can be further adjusted with respect to the circuit with the NMOS adjustment method as illustrated in FIG. 2, the degree of freedom of the circuit threshold value adjustment can be further improved.

As illustrated, the first and second inverters INV1-1 and INV1-2 regarding the NMOS/PMOS transistor adjustment method are different from those as illustrated in FIG. 2 on the point that they further include PMOS transistors P-1 to P-4 and P00 to P07.

The input signal In is given to the gates of the PMOS transistors P-1 to P-4, and the drains thereof are connected to the output terminal OUTn.

The drains of the PMOS transistors P00 to P07 are connected to the sources of the PMOS transistors P-0 to P-4, respectively, and the drains thereof are connected to the output terminal OUTn. Since the ground power supply voltage Vss is given to the gate of the first switch PMOS transistor P00, the PMOS transistor P00 is constantly turned on. On the other hand, the reason why the transistor is constantly turned on is the same as that as described above.

On the other hand, four-bit trim signals Trim4 to Trim7 are input to gates of other four switch PMOS transistors P04 to P07 respectively.

According to the above-described configuration, since the switch NMOS transistors N10 to N13 and the switch PMOS transistors P04 to P07 are turned on/off according to the values of the input trim signals Trim0 to Trim7, the gate width values W of the NMOS transistors N-0 to N-4 and the gate width values W of the PMOS transistors P-0 to P-4 can be selectively changed from 1 W to 16 W.

1-3. Regarding Detection of the Circuit Threshold Value of a Circuit Threshold Value Monitor Next, referring to FIG. 4, the detection of the circuit threshold value of the circuit threshold value monitor 13 in this embodiment will be described.

As illustrated, by the short-circuit input and output of the second inverter INV1-2, the PMOS and NMOS transistors P13 and N13 (hereinafter indicated as representatives) that constitute the inverter INV1-2 operate as pentodes to make current ip and current in flow out. The gate voltage when the two current values ip and in become equal to each other becomes the circuit threshold value Vthout.

Here, if the input voltage of the inverter INV1-2 becomes higher than this value, the current in that flows through the NMOS transistor N13 is increased and the current ip of the PMOS transistor P13 is decreased, so that the output of the inverter INV1-2 is transited to "0". On the other hand, if the input voltage of the inverter INV1-2 becomes lower than this value, the current in of the NMOS transistor N13 is decreased and the current ip of the PMOS transistor P13 is increased, so that the output of the inverter INV1-2 is transited to "1". The trim value (parameter value) is determined by detecting the output of the inverter INV1-2 through a memory tester and so on to be described later.

2. A Method of Correcting a Circuit Threshold Value Voltage of an Input Buffer (Trim Value Write/Read Operation)

2-1. Trim Value Write Operation

Figure 5:
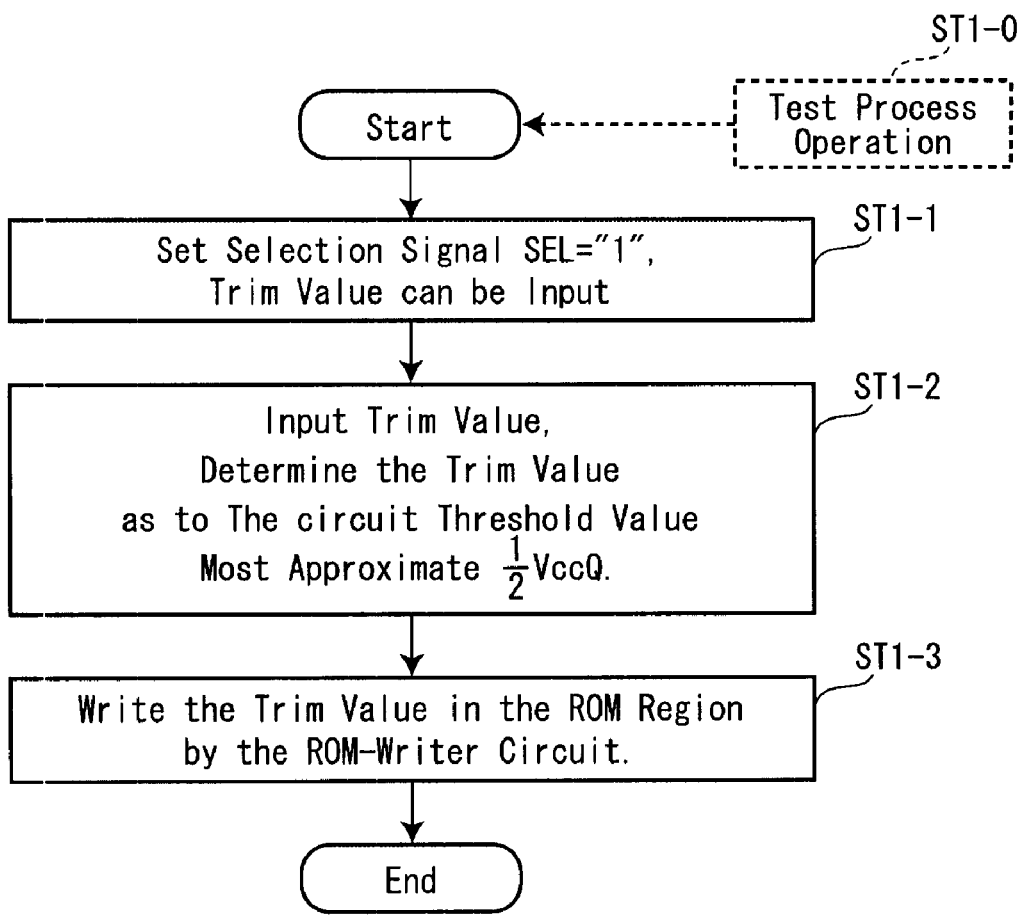
FIG. 5 is a flowchart illustrating a trim value write operation of a nonvolatile semiconductor memory device according to a first embodiment of the invention.

First, referring to FIGS. 5 and 6, a trim value write operation in a nonvolatile semiconductor memory device according to the first embodiment of the present invention will be described. Here, the trim value write operation will be described with reference to the flowchart of FIG. 5.

Step ST1-0

This operation is performed, for example, during a test process such as during factory shipment of the nonvolatile semiconductor memory device.

Step ST1-1

First, by making the selection signal SEL output from the control circuit (not illustrated) and so on "1", the input of the selector 17 is switched to the output of the trim value input circuit 21, and thus the trim value can be input to the selector 17 from the outside.

Step ST1-2

Figure 6:
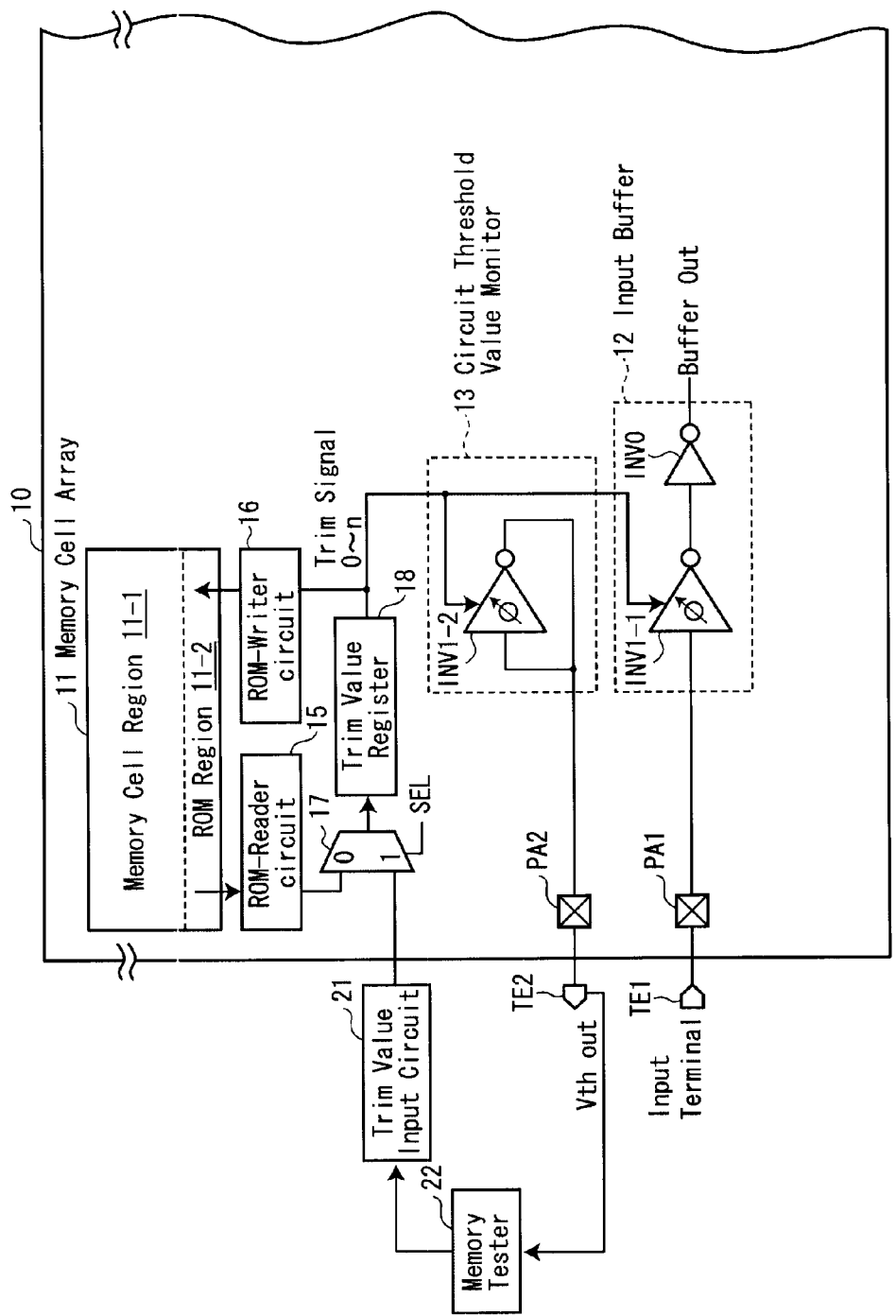
FIG. 6 is a block diagram illustrating a trim value write operation of a nonvolatile semiconductor memory device according to a first embodiment of the invention.

Then, as illustrated in FIG. 6, in step ST1-2, the input is connected to the circuit threshold value voltage output Vthout, and a memory tester 22, the output of which is connected to the trim value input circuit 21, is arranged, and the trim value for which the circuit threshold value most approximates ½ of VccQ is determined.

More specifically, using the memory tester 22 and so on, the output voltage Vthout of the circuit threshold value monitor 13 is compared with ½ of the voltage value of an external power supply voltage VccQ, and the trim values (parameter values: Trim0 to Trimn) are sequentially input by the trim value input circuit 21. Also, the trim value (parameter value: Trim0 to Trimn) for which the circuit threshold value of the output voltage Vthout of the circuit threshold value monitor 13 most approximates ½ of VccQ is determined.

Step ST1-3

Then, the determined trim value (parameter value: Trim0 to Trimn) output from the trim value register 18 is written in the ROM region 11-2 by the ROM-writer circuit 16.

2-2. Trim Value Read Operation

Figure 7:
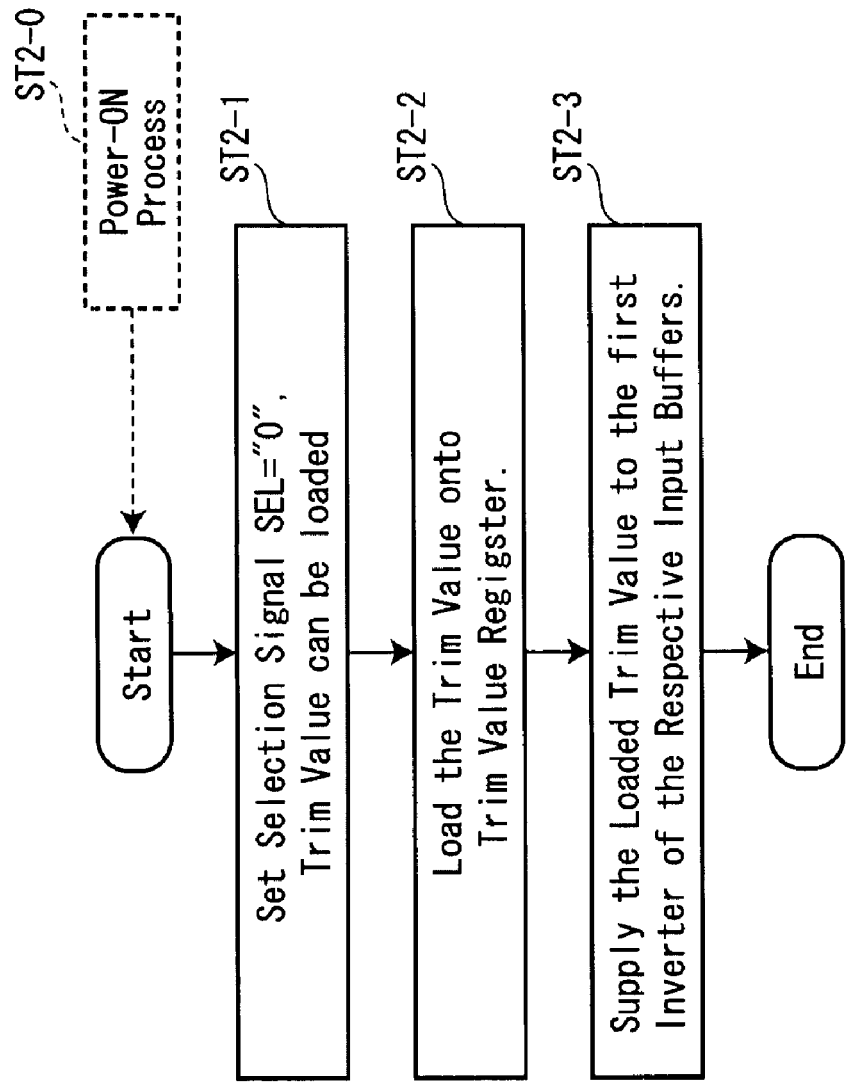
FIG. 7 is a flowchart illustrating a trim value read operation of a nonvolatile semiconductor memory device according to a first embodiment of the invention.

Next, referring to FIG. 7, a trim value read operation in a nonvolatile semiconductor memory device according to the first embodiment of the present invention will be described. Here, the trim value read operation will be described with reference to the flowchart of FIG. 7.

Step ST2-0

This operation is performed, for example, before the nonvolatile memory device is used, for example, during a power-on process.

Step ST2-1

First, by making the selection signal SEL output from the control circuit (not illustrated) and so on "0", the input of the selector 17 is switched to the output of the ROM-reader circuit 15, and thus the trim value is loaded onto the selector 17.

Step ST2-2

Then, the stored trim values (parameter values: Trim0 to Trimn) are read from the ROM region 11-2 to the selector 17 by the ROM-reader circuit 15, and the read trim values are loaded onto the trim value register 18.

Step ST2-3

Then, the loaded trim values (parameter values: Trim0 to Trimn) are supplied to the first inverters INV1-1 of the respective input buffers 12, respectively. Accordingly, the optimum β ratio in which the circuit threshold value of the input buffer 12 becomes ½ of VccQ can be adjusted.

As described above, according to the configuration and correction method according to this embodiment, a difference between circuit threshold values of the transistors for each device (chip) is corrected, and thus it becomes possible to make the duty of the input buffer about 50% in any chip. Accordingly, the duty error can be reduced, and thus the device is advantageous in high-speed data input/output.

According to the nonvolatile semiconductor memory device and the method of correcting the circuit threshold value according to the first embodiment of the present invention, at least the following effects (1) to (2) can be obtained.

(1) The duty error can be reduced and the device is advantageous in high-speed data input/output.

As described above, the nonvolatile memory device according to the first embodiment of the present invention includes an input buffer 12 provided with a first inverter INV1-1 that can electrically adjust circuit threshold values; a circuit threshold value monitor 13 provided with a second inverter INV1-2 having the same circuit configuration as the first inverter INV1-1 to detect the circuit threshold values of the first inverter INV1-1 when the input and output of the second inverter INV1-2 are short-circuited, respectively; a memory 11-2 storing parameter values (trim values: Trim0 to Trimn) when the circuit threshold value of the first inverter INV1-1 coincides with (corresponds to) the circuit threshold value detected by the circuit threshold value monitor 13; and a data-reader circuit 15 reading the parameter values given to the first inverter from the memory 11-2.

Accordingly, even in the inverter type input buffer 12 according to this embodiment, the circuit threshold value of the input buffer 12 can be made to approximate the neighborhood of an intermediate voltage (½ of VccQ) of the power supply voltage regardless of the difference between the circuit threshold values of the transistors for each device (chip) or the used power supply voltage conditions. Accordingly, delay times when the input of the nonvolatile memory device rises or falls can be made equal to each other. Further, the margin of the setup/hole time when serial data is input can be secured at maximum.

As a result, the duty error in the input buffer 12 can be suppressed at minimum, and thus it is possible to suppress the difference of data windows of the serial data outputs. For example, it becomes possible to make the duty of the input buffer about 50% in any chip. Accordingly, the duty error can be reduced, and thus the device is advantageous in high-speed data input/output.

(2) An access cycle time can be shortened, and thus high speed operation can be achieved.

In the case where the configuration and operation according to this embodiment is applied to a device that adopts a high-speed serial data interface, which may be represented by the next-generation NAND flash memory, the cycle time of the serial access can be shortened. Accordingly, the cycle time of the serial access of such as device can be shortened, and thus the high speed operation can be achieved.

As described above, this embodiment may be an efficient technology with respect to a device that adopts the high-speed serial data interface that is represented by the next-generation NAND flash memory.

Second Embodiment (an Example of Automatically Adjusting the Circuit Threshold Value)

Figure 9:
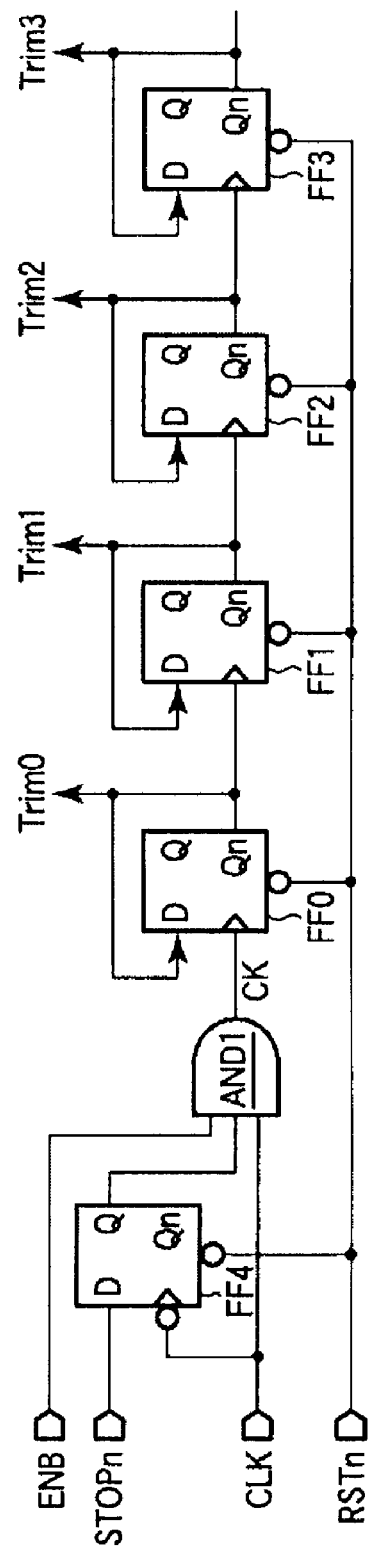
FIG. 9 is a block diagram illustrating a configuration example of a trim value counter according to the second embodiment of the invention.
Figure 10:
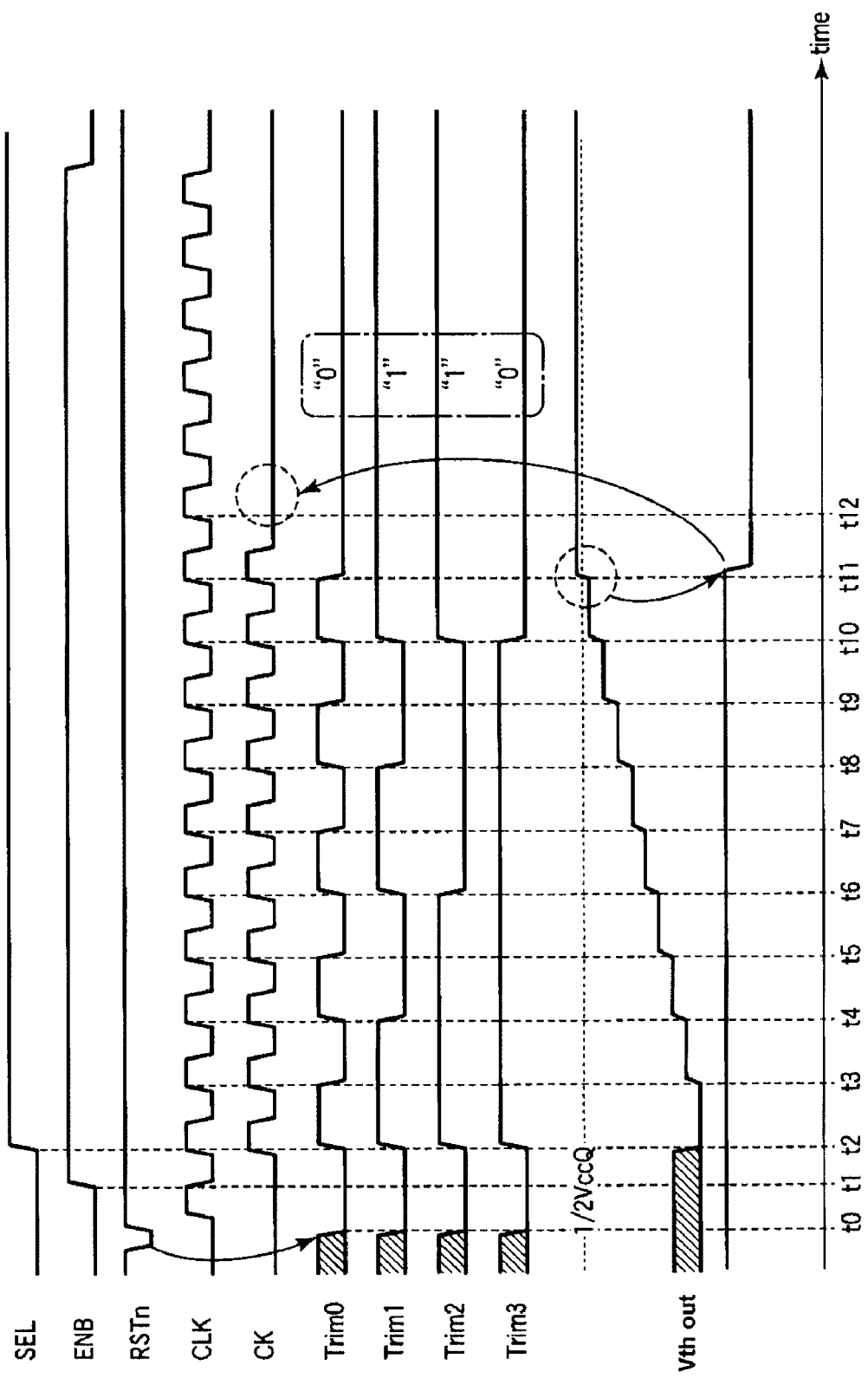
FIG. 10 is a timing chart illustrating an operation of a trim value counter according to the second embodiment of the invention.

Next, referring to FIGS. 8 to 10, a nonvolatile semiconductor memory device according to a second embodiment of the invention will be described. In this explanation, the detailed description of a portion that overlaps the first embodiment as described above will be omitted.

First, referring to FIG. 8, the summary of the nonvolatile semiconductor memory device according to the first embodiment will be described.

As illustrated, the second embodiment is different from the first embodiment on the point that this embodiment further includes a trim value counter 25 and a comparator COM provided inside the device rather than inputting the trim values from the outside of the device according to the first embodiment. Further, the circuit threshold value voltage Vthout from the circuit threshold value monitor 13 according to the trim values Trim0 to Trimn sequentially generated by the counter output of the trim value counter 25 is compared with the ½ of VccQ by the comparator COM. The count operation of the trim value counter 25 is controlled (STOPn) by the output of the comparator COM, and the value of the trim signal when the circuit threshold value voltage Vthout exceeds ½ of VccQ is stored in the trim value register 18 to be used as the circuit threshold value voltage of the input buffer 12.

Configuration Example

The Whole Configuration Example

Figure 8:
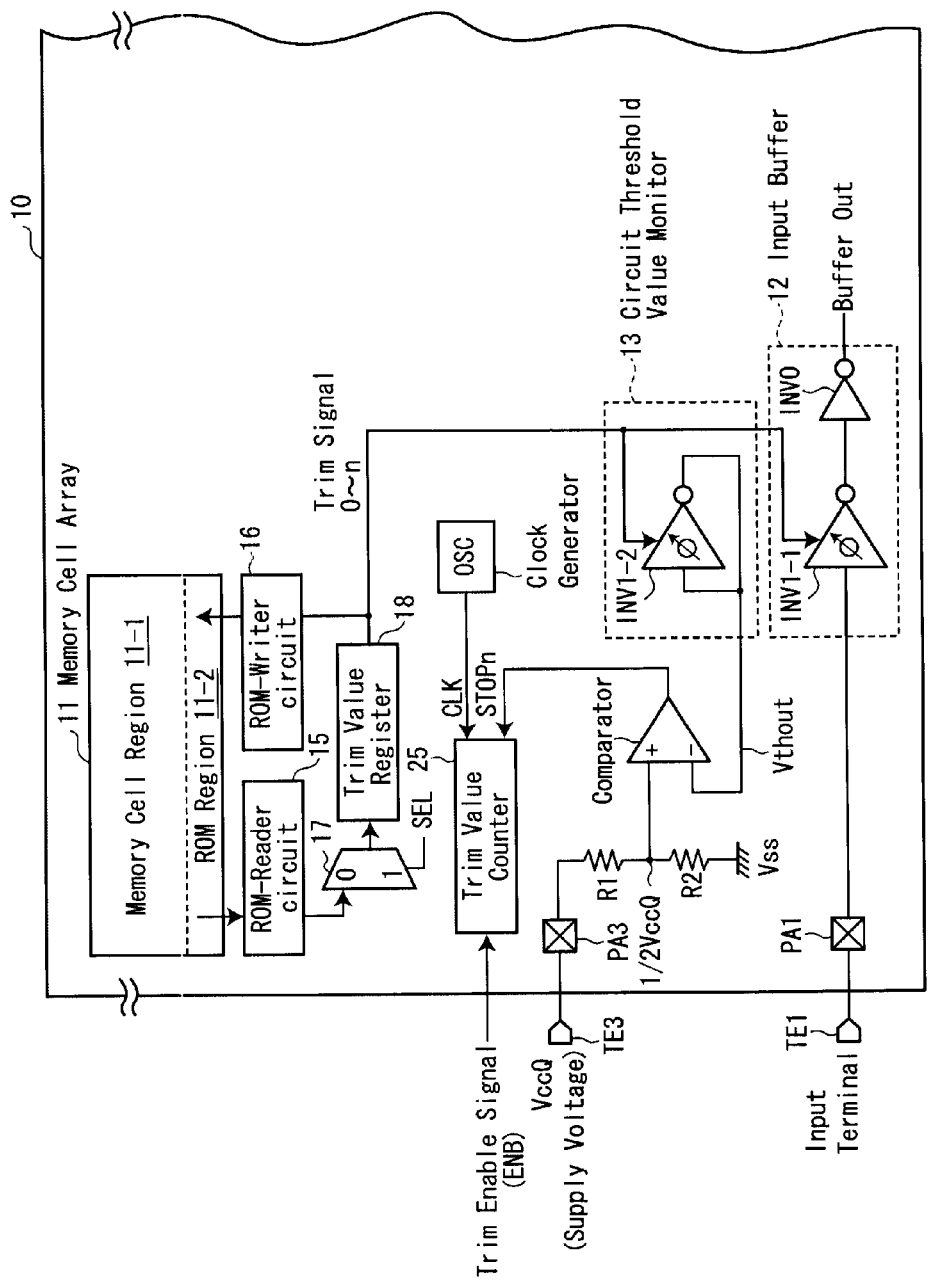
FIG. 8 is a block diagram illustrating a whole configuration example of a nonvolatile semiconductor memory device according to a second embodiment of the invention.

With reference to FIG. 8, the whole configuration example of a nonvolatile semiconductor memory device according to a second embodiment of the present invention will be described in detail.

As illustrated, a special cell region 11-2 that is called a ROM block is provided inside the memory cell array 11, and a data-writer circuit 16 and a data-reader circuit 15 for this region 11-2 are provided. Further, this embodiment is different from the first embodiment on the point that the output of the reader circuit 15 is connected to an input terminal "0" on one side of the selector 17, and the output of the trim value counter 25 is input to the other input terminal "1".

The output of the selector 17 is input to the trim value register 18, and the output (trim value) of the trim value register 18 is given to the ROM region 11-2 through the ROM-writer circuit 16, to the circuit threshold value monitor 13 provided with inverters INV1-1 and INV1-2 having the trim function, and to the input buffer 12, respectively.

As described above, the nonvolatile semiconductor memory device according to this embodiment further includes the trim value counter 25, the comparator COM, voltage dividing resistors R1 and R2, a clock generator OSC, a pad PA3, and a power supply terminal TE3.

The output voltage Vthout of the circuit threshold value monitor 13 is input to the input (−) of the comparator COM, and ½ of the supply voltage VccQ generated by resistor dividers and so on is input to the input (+) of the comparator. The comparator controls the trim value counter 25 by comparing the input voltages. In other words, the comparator COM compares the output Vthout of the circuit threshold value monitor 13 with the reference electric potential (½ of VccQ), and outputs a count stop signal STOPn when the compared values correspond to each other, of which the details will be described later.

The trim value counter 25 receives a trim enable signal ENB from the outside of the device, a clock signal CLK generated by the clock generator OSC from the inside of the device, and the output signal (count stop signal) STOPn of the comparator COM. The output of the trim value counter 25 is connected to the input terminal "1" of the selector. On other words, the trim value counter 25 is configured to sequentially generate parameter values through the count operation until the count stop signal STOPn is input, of which the details will be described later.

The resistors R1 and R2 divide the external power supply voltage VccQ that is given from the outside of the device through the terminal TE3 and the pad PA3 into ½ of VccQ at a common node. That is, one terminal of the resistor R1 is connected to the pad PA3. One terminal of the resistor R2 is connected to the other terminal of the resistor R1 and the input (+) of the comparator, and the other terminal of the resistor R2 is connected to the ground power supply voltage Vss.

Other configurations, such as the input buffer 12, the circuit threshold value monitor 13, and the like, are substantially the same as those in the first embodiment, and thus the detailed description thereof will be omitted.

Configuration Example of a Trim Value Counter

Next, with reference to FIG. 9, the configuration example of the trim value counter 25 according to the second embodiment will be described in detail. Here, it is exemplified that the trim value counter is controlled by four-bit trim signals Trim0 to Trim3.

As illustrated, the trim value counter 25 according to this embodiment includes five D-type flip-flop (D-FF) circuits FF0 to FF4 and a three-input AND gate AND1.

The five D-type flip-flop (D-FF) circuits FF0 to FF4 have one reset terminal, one clock terminal, a data input terminal D, a non-inverting output terminal Q, and an inverting output terminal Qn.

The output STOPn of the comparator COM is input to the data input terminal D of the first stage flip-flop circuit FF4, a signal that is obtained by inverting the clock signal CLK is input to the clock input terminal, and the non-inverting output Q is connected to one input terminal of the AND gate AND1.

In the second to fifth stage flip-flop circuits FF0 to FF3, respective data input terminals D are connected to their inverting outputs Qn, and the inverting outputs Qn are also connected to the next stage clock input terminals. Further, their four inverting outputs Qn are generated and output as respective trim signals Trim0 to Trim3.

Also, a reset signal RSTn is commonly input to the reset terminals of the five flip-flops FF0 to FF4.

The clock signal CLK and the trim enable signal ENB are input to two inputs of the three-input AND gate AND1, and the output CK of the AND gate AND1 is connected to the clock input terminal of the second stage flip-flop circuit FF0.

A Method of Correcting a Circuit Threshold Value of an Input Buffer (Trim Value Counter Operation)

Next, a trim value counter operation in a nonvolatile semiconductor memory device according to the second embodiment of the invention will be described, and here, with reference to the timing chart of FIG. 10. Here, the trim value counter operation may be performed during a test process such as factory shipment and the like, or before a user actually uses the chip, for example, so that a power supply voltage after the power-on process is automatically performed in stable timing.

As illustrated, by making the selection signal SEL at "0" level at an initial time t0, and making the RSTn signal at "0" level in a state where the trim enable signal ENB is at "0" level, the trim signals Trim0 to Trim3 output from the flip-flop circuits FF0 to FF3 of the trim value counter 25 are once reset to "0" level.

Then, at time t1, by making the trim enable signal ENB at "1" level, the clock signal CK is supplied to the trim value counter 25, and at a rising edge of the initial CK, all of the trim signals Trim0 to Trim3 are at "1" level.

Then, at time t2, by making the selection signal SEL of the selector at "1" level, the trim signals Trim0 to Trim3 are supplied to the circuit threshold value monitor 13 via the trim value register 18, and the comparator COM compares the circuit threshold value voltage Vthout that is the output of the circuit threshold value monitor 13 with ½ of VccQ.

Then, after time t3, the same operation as that at time t1 is sequentially performed until the circuit threshold value voltage, which is compared by the comparator COM, becomes higher than ½ of VccQ.

That is, in the same manner as that at time t1, if the trim value counter 25 sequentially counts down the trim signal Trim0 to Trim3 at a rising edge of the clock signal CK, for example, the NMOS gate width W of the inverter INV1-2 having the trim function inside the circuit threshold value monitor 13 becomes relatively smaller than that of PMOS, and thus the circuit threshold value voltage Vthout is increased.

In this embodiment of the invention, at time t11, the circuit threshold value voltage Vthout exceeds ½ of VccQ at the $10^{th}$ clock signal CK. Accordingly, at a rising edge of the clock signal CK, the output signal STOPn of the comparator COM becomes "0".

Then, at time t12, the initial stage flip-flop circuit FF4, which receives STOPn from the trim value counter 25, supplies the state of STOPn to the three-input AND gate AND1 at a falling edge of the clock signal CLK. Accordingly, the clock signal CK after the $11^{th}$ clock is not generated, and thus the count operation of the trim value counter 25 can be stopped.

As a result, the count values "0", "1", "1", and "0" at time t12 remain in a stored state on the trim value register 18. Thereafter, the trim values (parameter values: Trim0 to Trim3 (in this embodiment, the count values "0", "1", "1", and "0")) stored in the trim value register 18 are used as the circuit threshold values that are provided to the first inverter INV1-1 of the input inverter 12 in the same manner as the first embodiment.

At this time, in the case of performing the trim value counter operation during a test process such as factory shipment and so on, in this timing (after time t12), it is sufficient if the trim values stored in the trim value register are written in the ROM region 11-2 according to the ROM-writer circuit 16. Also, in the case of performing the trim value counter operation after the power-on process and so on, it is not specially required to write the trim values in the ROM region 11-2, and during the use of the device (chip), the values stored in the trim value register 18 may be used.

As described above, according to the nonvolatile semiconductor memory device and the operation thereof according to the second embodiment of the present invention, at least the same effects as the above-described effects (1) to (2) can be obtained. Further, at least the following effect (3) can be obtained.

(3) The convenience and reliability can be improved.

As described above, according to this embodiment, the trim value counter 25 and the comparator COM are further provided inside the device rather than inputting the trim values from the outside of the device as in the first embodiment of the invention. Further, the circuit threshold value voltage Vthout from the circuit threshold value monitor 13 according to the trim values Trim0 to Trimn sequentially generated by the counter output of the trim value counter 25 is compared with the ½ of VccQ by the comparator COM. The count operation of the trim value counter 25 is controlled (STOPn) by the output of the comparator COM, and the value of the trim signal when the circuit threshold value voltage Vthout exceeds ½ of VccQ is stored in the trim value register 18 to be used as the circuit threshold value voltage of the input buffer 12.

Accordingly, the determination of the trim value can be performed even after the power-on process in which a user actually starts the device, without being limited to a term of the test process such as factory shipment and so on. In this case, it is not specially required to perform writing in the ROM region 11-2, and the trim value (parameter value: Trim0 to Trimn) stored in the trim value register 18 can be used during the use of the device (chip).

As described above, by determining the trim value (parameter value: Trim0 to Trimn) after the power-on process in which a user actually starts the device, the circuit threshold value of the input buffer 12 in a state of the actual use of the device can be determined. As a result, it is further advantageous in improving the user convenience and reliability.

Third Embodiment (an Example of Finely Adjusting an Input Signal)

Next, a nonvolatile semiconductor memory device according to a third embodiment of the invention will be described with reference to FIGS. 11 to 13. In this explanation, the detailed description of a portion that overlaps the second embodiment as described above will be omitted.

Figure 11:
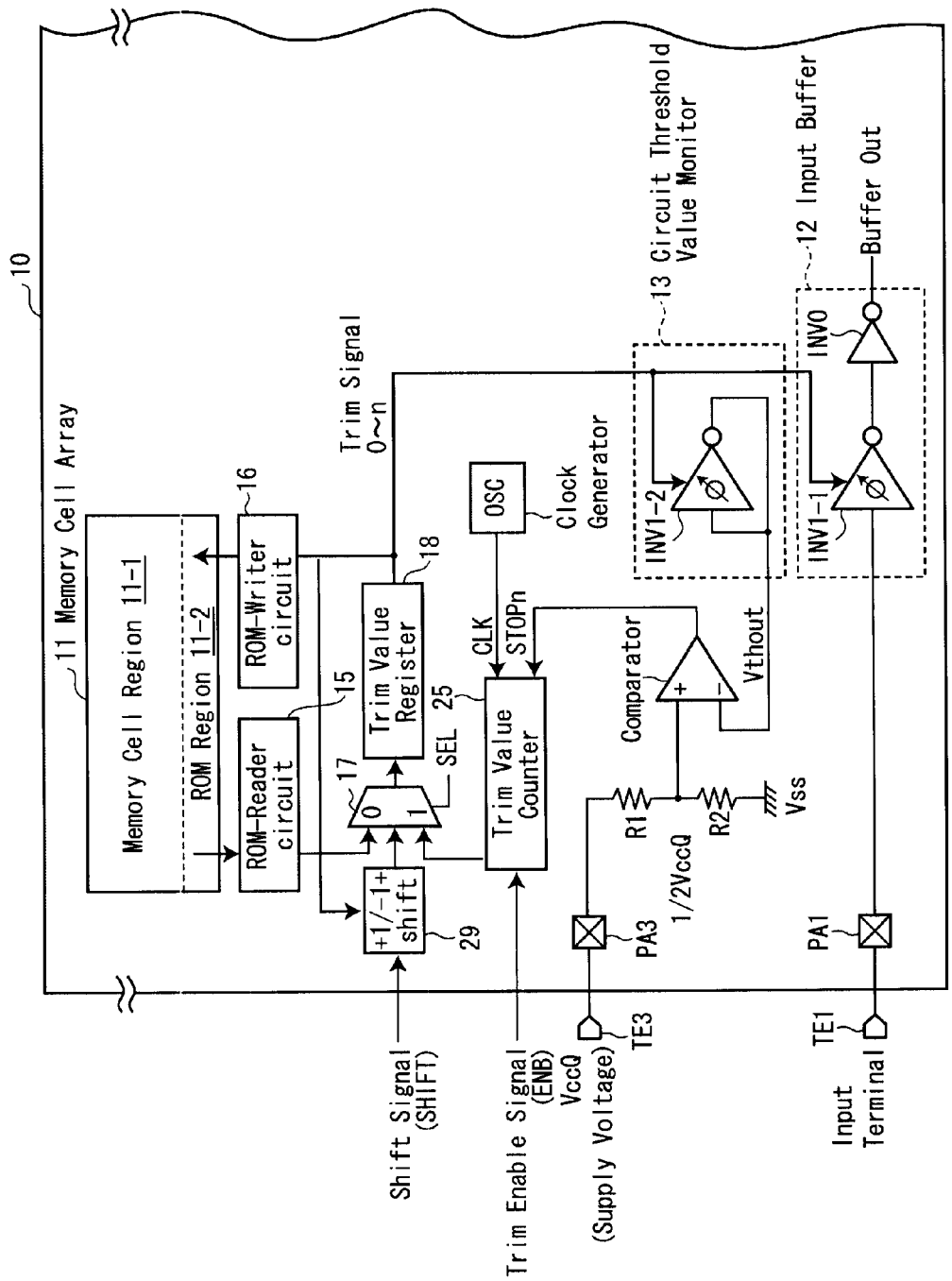
FIG. 11 is a block diagram illustrating a whole configuration example of a nonvolatile semiconductor memory device according to a third embodiment of the invention.

As illustrated in FIG. 11, the third embodiment is different from the second embodiment on the point that this embodiment further includes a shift circuit 29 as a means for performing fine adjustment of the trim value (parameter value: Trim0 to Trimn) that is adjusted by the trim value counter 25 under the control of a shift signal SHIFT from the outside of the device.

The shift circuit 29 performs fine adjustment of +1/−1 with respect to the trim value (Trim0 to Trimn) of the trim value register. Also, by making the output of the shift circuit 29 return to the trim value register 18 through the selector 27, for example, the duty of the output of the input buffer 12 can be made to approximate 50% even if the duty of the input signal that is supplied from the memory controller on the outside of the device deviates from 50%.

Details

A Configuration Example

With reference to FIG. 11, the whole configuration example of a nonvolatile semiconductor memory device according to a third embodiment of the present invention will be described in detail. As illustrated, this embodiment is different from the second embodiment on the point that the nonvolatile semiconductor memory device according to the third embodiment further includes the shift circuit 29 and the selector 27 is further provided with a third input terminal.

In the same manner as the second embodiment, a special cell region of a ROM region 11-2 is provided inside the memory cell array 11, and a data-writer circuit 15 and a data-reader circuit: 16 for this region are provided. The output of the reader circuit 16 is connected to the first input terminal "00" of the selector 27. The second input terminal "01" of the selector is connected to the output of the trim value counter 25, and the third input terminal "10" thereof is connected to the output of the shift circuit 29.

The shift circuit 29 is controlled by a control signal (here, shift signal SHIFT) input from a control circuit from the outside of the device (chip), and outputs the result of fine adjustment of +1/−1 with respect to the trim value (Trim0 to Trimn) of the trim value register to the third input terminal "10" to the selector.

The output of the selector 27 is input to the trim value register 18, and the output (trim value (parameter value: Trim0 to Trimn)) of the trim value register 18 is given to the ROM region 11-2 through the writer circuit 15. Further, the output (trim value) of the trim value register 18 is also input to the circuit threshold value monitor 13 composed of the inverter INV1-2 having the trim function, the respective input buffer 12, and the shift circuit 29.

The trim value counter 29 receives the trim enable signal ENB from the outside of the device, the clock signal CLK generated by the clock generator from the inside of the device, and the output STOPn of the comparator. To the input of the comparator, the output voltage of the circuit threshold value monitor and ½ of the power supply voltage VccQ generated through the voltage divider and so on are input.

The trim value (parameter value: Trim0 to Trimn) by the trim value counter 25, as described above, may be processed during a test process such as factory shipment and so on, or before the user actually use the chip, for example, so that a power supply voltage after the power-on process is automatically performed in stable timing.

Output Operation of an Input Buffer (Buffer Output)

Next, with reference to FIGS. 12 and 13, the output operation of the input buffer 12 (buffer output) of the nonvolatile semiconductor memory device according to the third embodiment of the invention will be described.

Here, if the duty of the control signal or data signal that is supplied from the memory controller to the nonvolatile semiconductor memory device deviates from, for example, 50% after the assembling of the system, the output of the input buffer 12 maintains the duty of the input signal even if the circuit threshold value of the input buffer 12 is made to suit ½ of VccQ by the trim value counter 25, and there is a possibility that window blurring of the data output occurs. FIGS. 12 and 13 are to explain this phenomenon.

Figure 12:
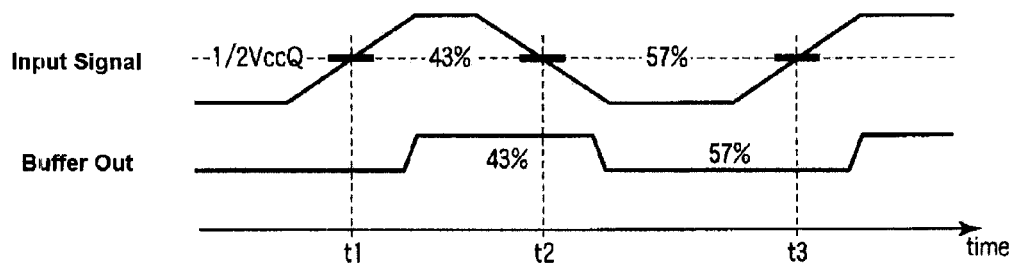
FIG. 12 is a timing chart illustrating an output operation of an input buffer according to the third embodiment of the invention.

FIG. 12 is a timing chart illustrating a case (a) in which the duty of the input signal deviates from 50% and the circuit threshold value of the input buffer 12 corresponds to ½ of VccQ.

Figure 13:
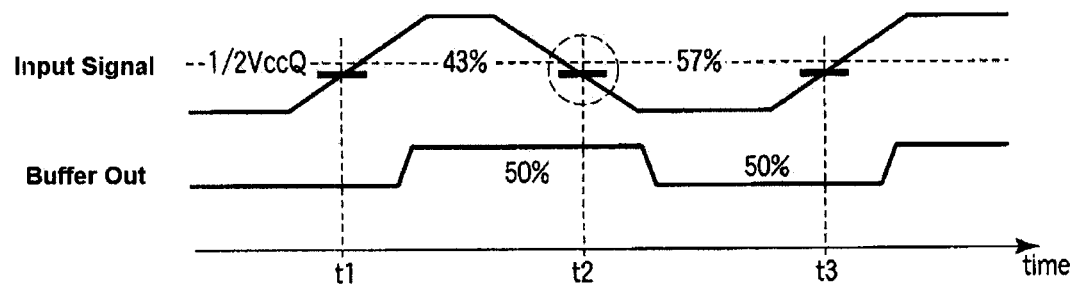
FIG. 13 is a timing chart illustrating an output operation of an input buffer according to the third embodiment of the invention.

FIG. 13 relates to this embodiment, and is a timing chart illustrating a case (a) in which the duty of the input signal deviates from 50% and thus the circuit threshold value is set to somewhat low with respect to FIG. 12. In FIG. 12, the deviation of the duty of the input signal (at time between t1 and t2, 43%, and at time between t2 and t3, 57%) follows in the buffer output as it is (43% and 57%). Accordingly, if the duty of the input signal deviates from 50%, for example, the output of the input buffer 12 maintains the duty of the input signal even if the circuit threshold value of the input buffer 12 is made to suit ½ of VccQ by the trim value counter 25, and there is a possibility that window blurring of the data output occurs.

On the other hand, in FIG. 13, it can be recognized that even if the deviation of the duty of the input signal (at time between t1 and t2, 43%, and at time between t2 and t3, 57%) occurs, the buffer output can be corrected to 50% and 50%.

More specifically, as the trim by the trim value counter 25, the circuit threshold value of the input buffer 12 is made to suit ½ of VccQ. Thereafter, by making the selection signal SEL of the selector 27 "10", the output of the shift circuit 29 can be loaded onto the trim value register 18.

Next, for example, by inputting the shift signal SHIFT using the control circuit such as the memory controller as monitoring the window of the data output, the fine adjustment of shifting the trim value (parameter value: Trim0 to Trimn) forward and backward is performed to find a point where the window of the data output becomes optimum. Then, the finally confirmed value is written in the ROM region 11-2 as the trim value (parameter value: Trim0 to Trimn) after the fine adjustment. Further, in the timing of power-on process before the chip is used, the trim value (parameter value: Trim0 to Trimn) after the fine adjustment is loaded onto the trim value register 18.

Accordingly, even if the deviation of the duty of the input signal (at time between t1 and t2, 43%, and at time between t2 and t3, 57%) as illustrated in FIG. 13 occurs, the buffer output of the input buffer 12 can be corrected to 50% and 50%.

As described above, according to the nonvolatile semiconductor memory device and the operation thereof according to the third embodiment of the present invention, at least the same effects as the above-described effects (1) to (3) can be obtained. Further, at least the following effect (4) can be obtained.

(4) The difference of outputs can be prevented by correcting the deviation of the duty of the input signal supplied from the outside of the device.

Further, the nonvolatile semiconductor memory device according to this embodiment is further provided with the shift circuit 29 and the selector 27 has even the third input terminal.

Accordingly, for example, by inputting the shift signal SHIFT using the control circuit such as the memory controller as monitoring the window of the data output, the fine adjustment of shifting the trim value (parameter value: Trim0 to Trimn) forward and backward is performed to find a point where the window of the data output becomes optimum. Then, the finally confirmed value is written in the ROM region 11-2 as the trim value (parameter value: Trim0 to Trimn) after the fine adjustment. Further, in the timing of power-on process before the chip is used, the trim value (parameter value: Trim0 to Trimn) after the fine adjustment is loaded onto the trim value register 18.

Accordingly, even if the deviation of the duty of the input signal (at time between t1 and t2, 43%, and at time between t2 and t3, 57%) as illustrated in FIG. 13 occurs, the buffer output of the input buffer 12 can be corrected to 50% and 50%. As a result, the deviation of the duty of the input signal supplied from the outside of the device such as a memory controller is corrected, and thus the duty of the buffer output can be constantly closer to 50%.

Fourth Embodiment (an Example that Copes with the Change of an Operation Condition after Trimming)

Next, with reference to FIGS. 14 and 15, a nonvolatile semiconductor memory device according to a fourth embodiment of the invention will be described. In this explanation, the detailed description of a portion that overlaps the first embodiment as described above will be omitted.

Figure 14:
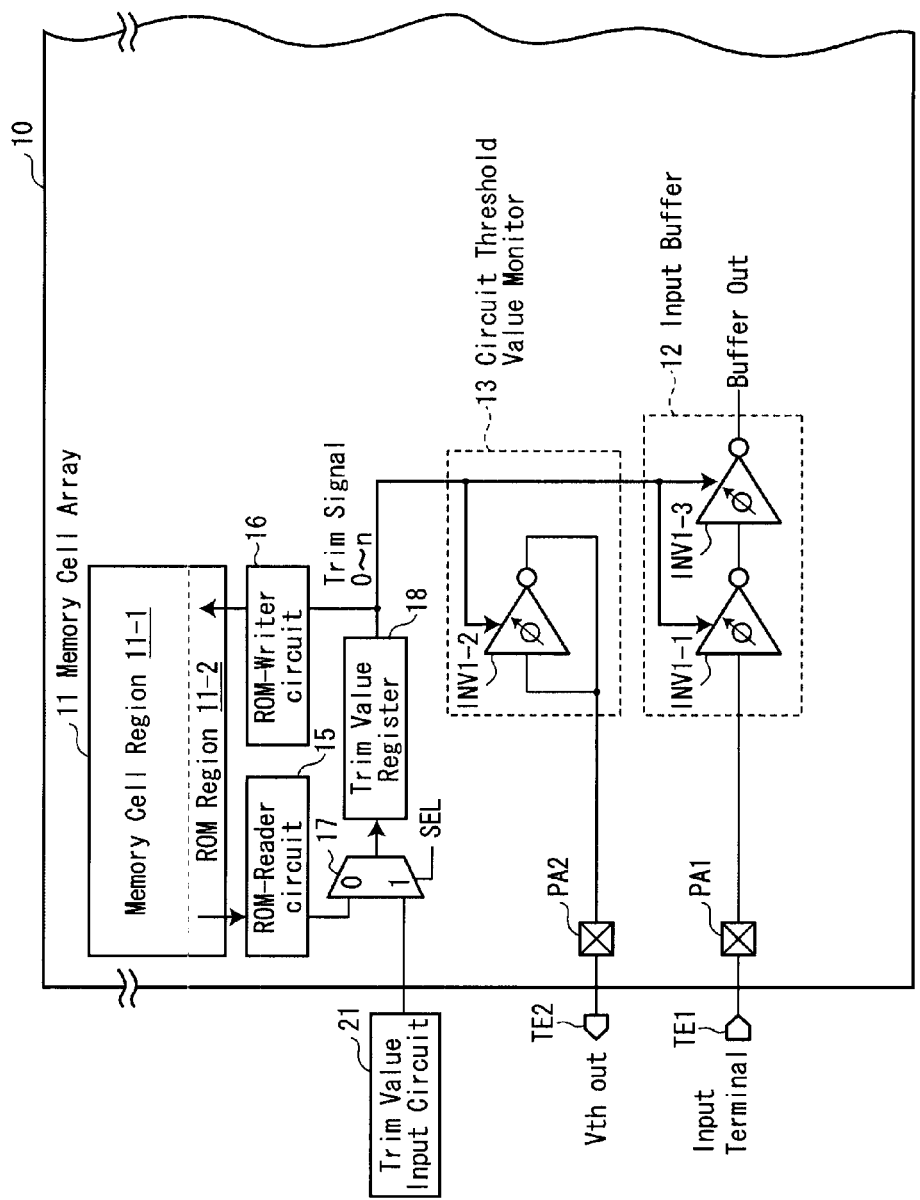
FIG. 14 is a block diagram illustrating a whole configuration example of a nonvolatile semiconductor memory device according to a fourth embodiment of the invention.

As illustrated in FIG. 14, the fourth embodiment is different from the first to third embodiments on the point that the nonvolatile semiconductor memory device according to the fourth embodiment further includes a third inverter INV1-3 which is provided on the next stage of the first inverter INV1-1 that receives the input in the input buffer 12 and which has a trim function which has the same circuit configuration as the first inverter INV1-1.

Output Operation of an Input Buffer (Buffer Output)

Next, with reference to FIG. 15, the output operation of the input buffer 12 (buffer output) of the nonvolatile semiconductor memory device according to the fourth embodiment of the invention will be described.

Here, even after the above-described trim value writing operation, the rising delay and the falling delay may not be equal to each other due to the change of the operation conditions such as voltage, temperature, and the like. Even in this case, according to this embodiment, the duty of the buffer output can be set to 50%.

For example, as illustrated, since the rising delay tDr at time t1 and the falling delay tDf at time t3 become different from each other with respect to the output of the first stage (first inverter INV1-1) regardless of whether the duty of the input signal is 50%, the duty of the first stage output deviates to 60% and 40%.

However, in this embodiment, the third inverter INV1-3 having the trim function is further provided on the next stage of the first inverter INV1-1, which has the same circuit configuration as the first inverter INV1-1. Accordingly, since the second stage third inverter INV1-3 receives an input having a phase opposite to that of the first stage first inverter INV1-1, the difference between the delay times can be cancelled, and thus the duty of the input buffer 12 can be made to return to 50%.

As described above, according to the nonvolatile semiconductor memory device and the operation thereof according to the fourth embodiment of the present invention, at least the same effects as the above-described effects (1) to (2) can be obtained. Further, at least the following effect (5) can be obtained.

(5) Even if the operation conditions such as voltage, temperature, and the like, are changed after trimming, the duty of the input buffer 12 can be made to return to 50%.

Here, even after the above-described trim value writing operation, the rising delay and the falling delay may not be equal to each other due to the change of the operation conditions such as voltage, temperature, and the like.

Figure 15:
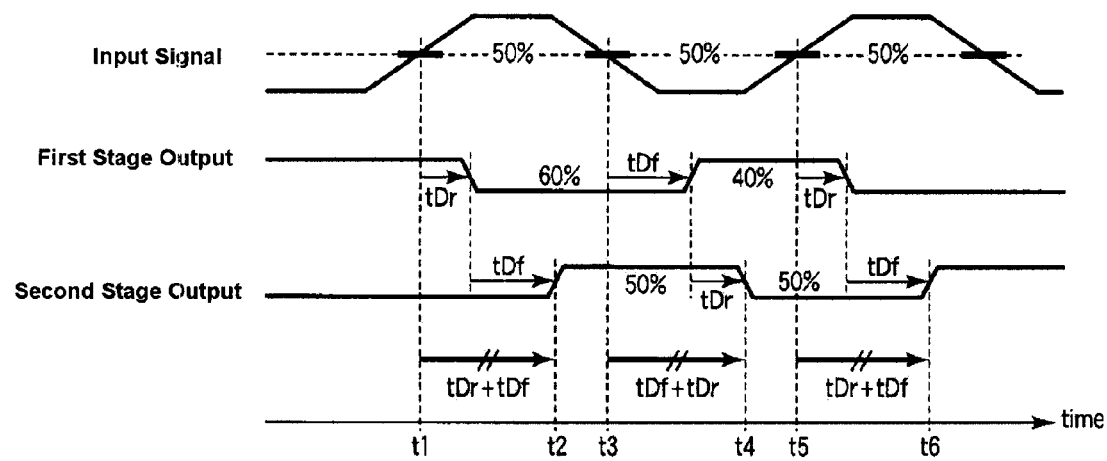
FIG. 15 is a timing chart illustrating an output operation of an input buffer according to the fourth embodiment of the invention.

For example, as illustrated in FIG. 15, since the rising delay tDr at time t1 and the falling delay tDf at time t3 become different from each other with respect to the output of the first stage (first inverter INV1-1) regardless of whether the duty of the input signal is 50%, the duty of the first stage output deviates to 60% and 40%.

However, in this embodiment, the third inverter INV1-3 having the trim function is further provided on the next stage of the first inverter INV1-1, which has the same circuit configuration as the first inverter INV1-1. Accordingly, since the second stage third inverter INV1-3 receives an input having a phase opposite to that of the first stage first inverter INV1-1, the difference between the delay times can be cancelled, and thus the duty of the input buffer 12 can be made to return to 50%.

Fifth Embodiment (an Example that can further Cope with the Change of an Operation Condition after Trimming)

Next, with reference to FIGS. 16 to 19, a nonvolatile semiconductor memory device according to a fifth embodiment of the invention will be described. In this explanation, the detailed description of a portion that overlaps the fourth embodiment as described above will be omitted.

The fifth embodiment is different from the fourth embodiment on the point that the nonvolatile semiconductor memory device according to the fifth embodiment further includes an element that adjusts a slew rate (a slope between outputs of the first and second inverters INV1-1 and INV1-2) with respect to the output of the first stage (first inverter INV1-1) and the output of the second stage (third inverter INV1-3) of the input buffer 12.

Accordingly, the slew rate of the input signal and the slew rate of the first stage and second stage outputs can coincide with each other at maximum. Accordingly, even if the operation conditions such as voltage, temperature, and the like, are changed after trimming, the duty of the input buffer 12 can be made to return to 50%.

Configuration Example

Figure 16:
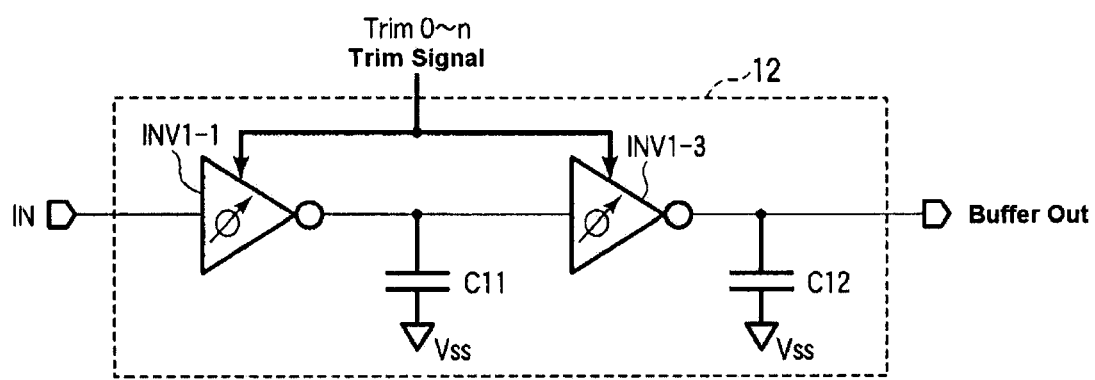
FIG. 16 is an equivalent circuit diagram illustrating a configuration example of an input buffer of a nonvolatile semiconductor memory device according to a fifth embodiment of the invention.

Next, with reference to FIGS. 16 to 18, several configuration examples of the input buffer according to the fifth embodiment will be described. The input buffer 12 as illustrated in FIG. 16 is an element for adjusting the slew rate, and may be composed of capacitors C11 and C12. As illustrated, one terminal of the capacitor C11 is connected to the output of the first stage (first inverter INV1-1) and the input of the second stage (third inverter INV1-3), and the other terminal of the capacitor is connected to the ground power supply voltage Vss. One terminal of the capacitor C12 is connected to the input of the second stage (third inverter INV1-2), and the other terminal of the capacitor is connected to the output terminal Buffout and the ground power supply voltage Vss.

Figure 17:
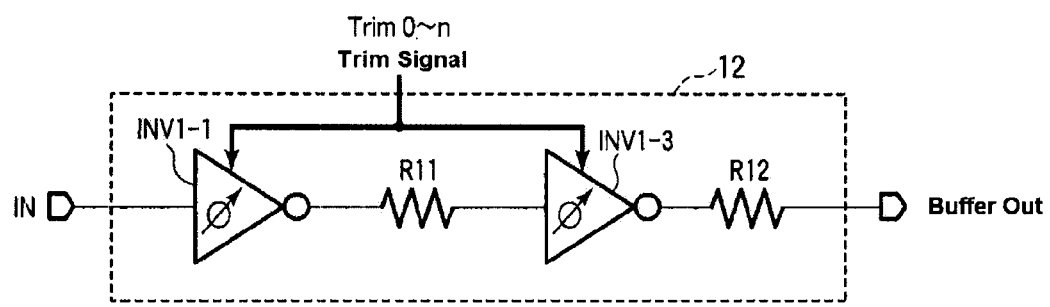
FIG. 17 is an equivalent circuit diagram illustrating a configuration example of an input buffer of a nonvolatile semiconductor memory device according to a fifth embodiment of the invention.

The input buffer 12 as illustrated in FIG. 17 is an element for adjusting the slew rate, and may be composed of resistors R11 and R12. As illustrated, the resistor R11 is inserted in series between the output of the first stage (first inverter INV1-1) and the input of the second stage (third inverter INV1-3). The resistor R12 is inserted in series between the output of the second stage (third inverter INV1-3 and the output terminal Buffout.

Figure 18:
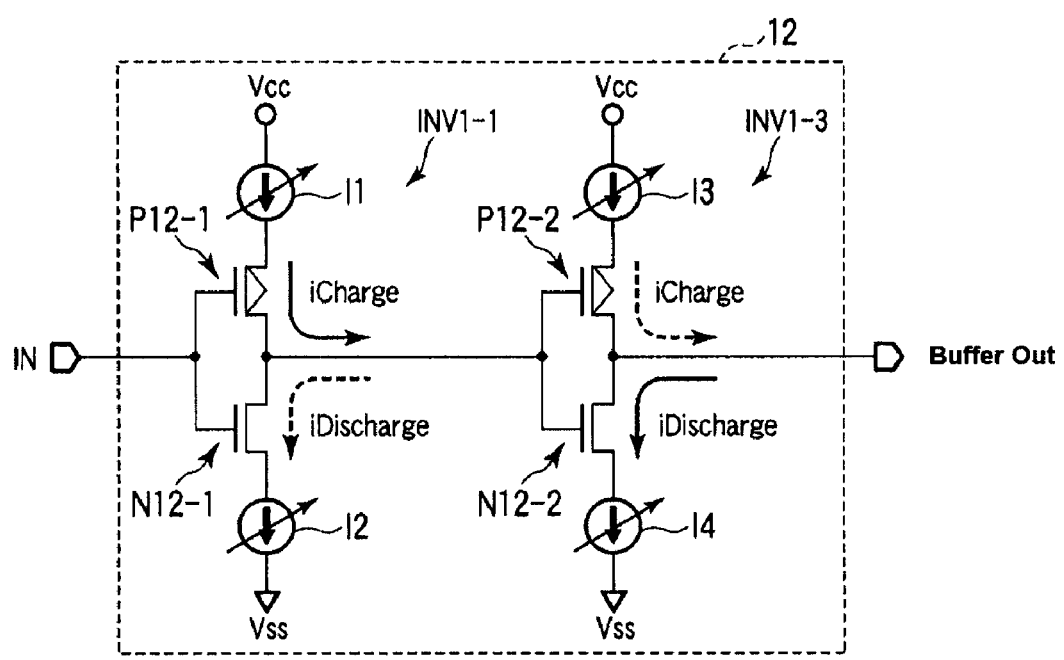
FIG. 18 is an equivalent circuit diagram illustrating a configuration example of an input buffer of a nonvolatile semiconductor memory device according to a fifth embodiment of the invention.
Figure 19:
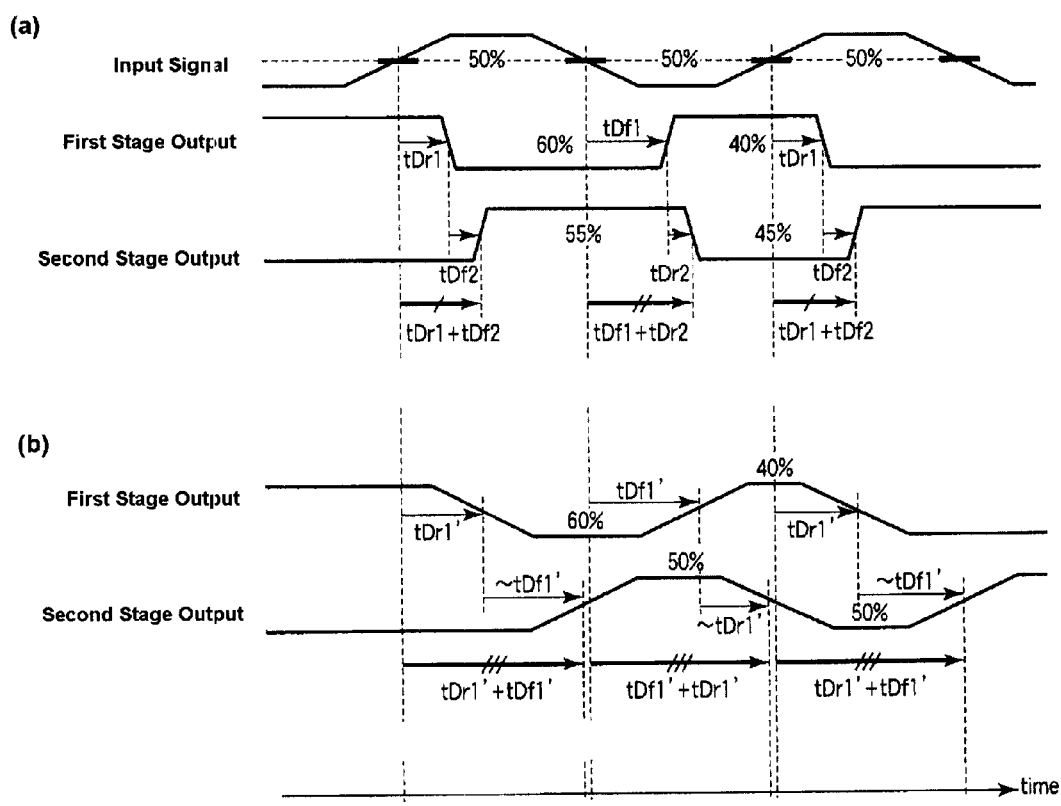
FIGS. 19A and 19B are timing charts illustrating an output operation of an input buffer according to the fifth embodiment of the invention.

The input buffer 12 as illustrated in FIG. 18 is an element for adjusting the slew rate, and may be composed of constant current sources I1 to I4. As illustrated, the input of the constant current source I1 is connected to the power supply voltage Vcc, and the output thereof is connected to the source of the transistor P12-1 that constitutes the first stage first inverter INV1-1. The input of the constant current source I2 is connected to the source of the transistor N12-1 that constitutes the first stage first inverter INV1-1, and the output thereof is connected to the ground power supply voltage Vss. The input of the constant current source I3 is connected to the power supply voltage Vcc, and the output thereof is connected to the source of the transistor P12-2 that constitutes the second stage third inverter INV1-3. The input of the constant current source I4 is connected to the source of the transistor N12-2 that constitutes the second stage third inverter INV1-3, and the output thereof is connected to the ground power supply voltage Vss.

According to the above-described configuration, the slew rate of the input signal and the slew rate of the first stage and second stage outputs can coincide with each other at maximum. As a result, even if the operation conditions such as voltage, temperature, and the like, are changed after trimming, the effect of offsetting the delay time difference can be further heightened, and thus the duty of the input buffer 12 can be made to return to 50%.

Output Operation of an Input Buffer (Buffer Output)

Next, with reference to FIGS. 19A and 19B, the output operation of the input buffer 12 (buffer output) of the nonvolatile semiconductor memory device according to the fifth embodiment of the invention will be described. FIGS. 19A and 19B are timing charts illustrating the further improved effect of offsetting the delay time difference obtained by the configuration that makes the slew rates coincide with each other according to this embodiment of the invention.

FIG. 19A shows a buffer output in the case where the slew rate adjustment is not performed. As illustrated, there is a difference between the rising delay tDr1 and the falling delay tDf1 in the first stage and the rising delay tDr2 and the falling delay tDf2 in the second stage. Accordingly, all the delay time difference even in the second stage output cannot be completely offset, and thus the duty, although the duty is somewhat improved, stays at 55% and 45%.

On the other hand, FIG. 19B shows the buffer output in the case where the slew rate correction has been made. As illustrated, since the first stage (first inverter INV1-1) and the second stage (third inverter INV1-3) operate on almost the same input conditions, the output delay time of the second stage can be set to the sum of the rising delay tDr1' and the falling delay tDf1' even in the case where the input is increased and decreased. Accordingly, as a result, the duty of the buffer output can be corrected to be closer to 50%.

As described above, according to the nonvolatile semiconductor memory device and the operation thereof according to the fifth embodiment of the present invention, at least the same effects as the above-described effects (1), (2), and (5) can be obtained. Further, at least the following effect (6) can be obtained.

(6) This embodiment can further cope with the change of the operation condition after trimming.

The nonvolatile semiconductor memory device according to the fifth embodiment further includes an element that adjusts the slew rate with respect to the output of the first stage (first inverter INV1-1) and the output of the second stage (third inverter INV1-3) of the input buffer 12.

Accordingly, the slew rate of the input signal and the slew rate of the first stage and second stage outputs can coincide with each other at maximum. Accordingly, even if the operation conditions such as voltage, temperature, and the like, are changed after trimming, the duty of the input buffer 12 can be further corrected to 50%.

For example, as illustrated in FIG. 19B, since the first stage (first inverter INV1-1) and the second stage (third inverter INV1-3) operate on almost the same input conditions, the output delay time of the second stage can be set to the sum of the rising delay tDr1' and the falling delay tDf1' even in the case where the input is increased and decreased. Accordingly, as a result, the duty of the buffer output can be further corrected to be closer to 50%.

Modified Example (Other Example)

Figure 20:
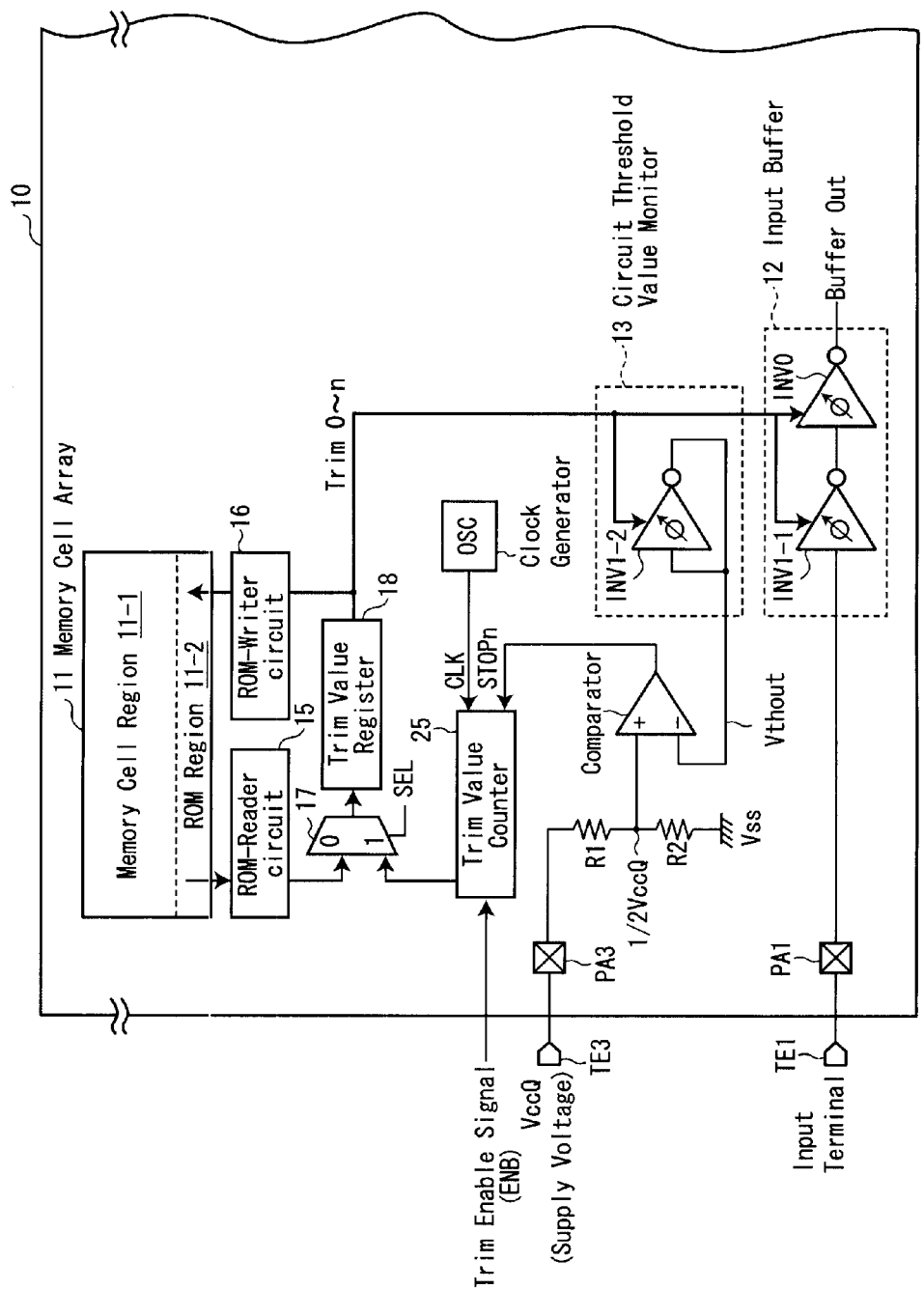
FIG. 20 is a block diagram illustrating a whole configuration example of a nonvolatile semiconductor memory device according to a modified example of the invention.

Next, referring to FIG. 20, the nonvolatile semiconductor memory device according to a modified example will be described. In this explanation, the detailed description of a portion that overlaps the first embodiment as described above will be omitted.

The present invention is not limited to the configurations and methods according to the first to fifth embodiments of the invention, and in a practical stage, diverse modifications are possible, without departing from the scope of the invention.

For example, in the configuration example as illustrated in FIG. 2C, the nonvolatile semiconductor memory device according to the modified example of the invention is different from the second embodiment on the point that the nonvolatile semiconductor memory device further includes a third inverter INV1-3 which has the same circuit configuration as the first inverter INV1-1 having the trim function as the second stage inverter of the input buffer 12. According to this configuration and the operation, the same working effects as those in the second embodiment or the fourth embodiment can be obtained.

In the practical stage, if necessary, diverse modifications are possible by an appropriate combination of a plurality of configuration conditions.

Comparative Example (an Example of Adjusting the Circuit Threshold Value of the Input Buffer by an Interconnection Layer Mask)

Next, referring to FIGS. 21 to 24, the nonvolatile semiconductor memory device and the operation thereof according to the comparative example will be described. This comparative example is an example of adjusting the circuit threshold values of the inverters of the input buffer through connection/disconnection of an interconnection layer mask. This comparative example is the inventor's subjective example for comparing with the nonvolatile semiconductor memory device and the correction method according to the first to fifth embodiments and the modified example, but does not configure the objective example of the related art and so on during the application of the invention.

Configuration Example
The Whole Configuration Example

Figure 21:
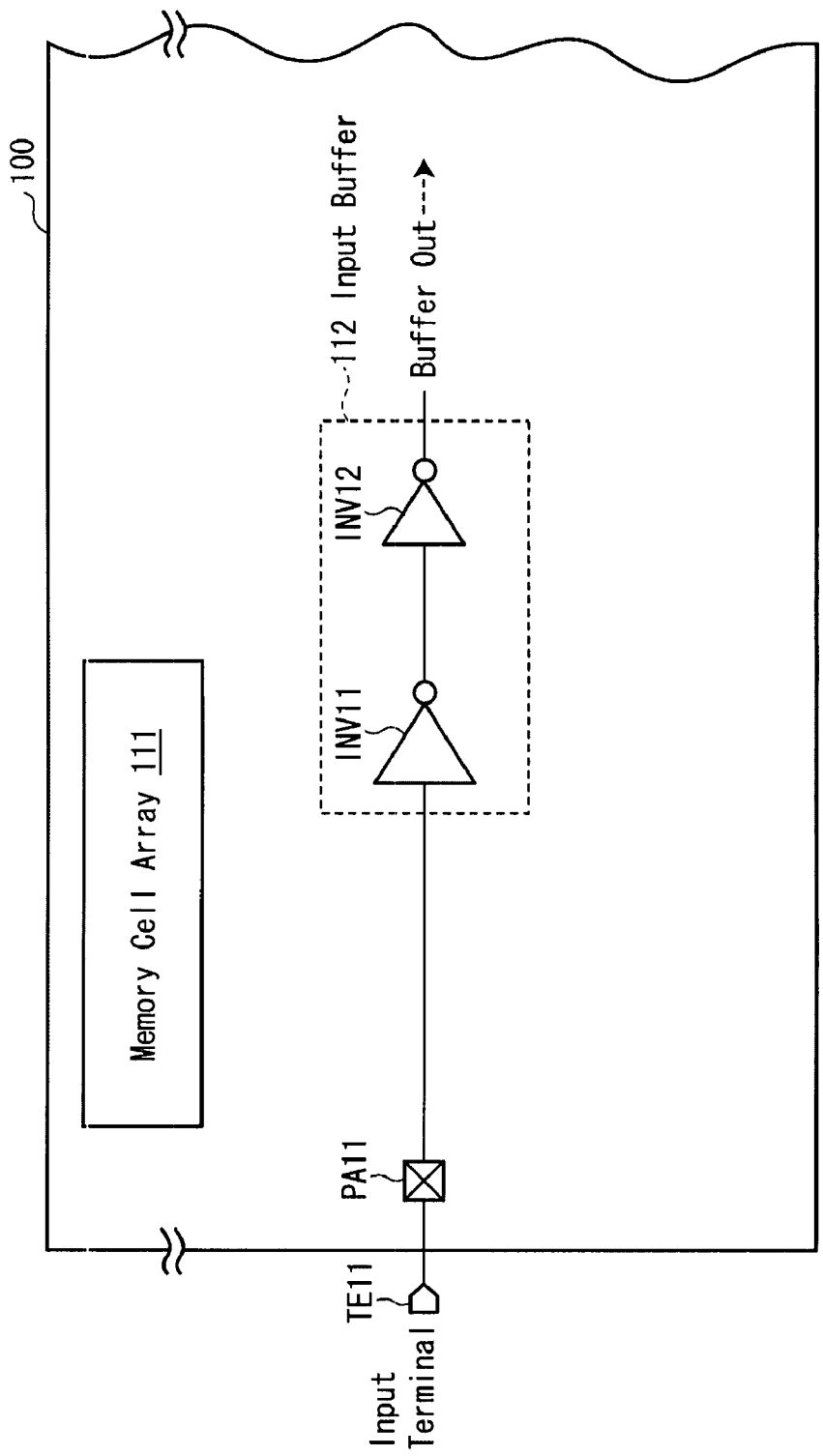
FIG. 21 is a block diagram illustrating a whole configuration example of a nonvolatile semiconductor memory device according to a comparative example of the invention.

First, referring to FIG. 21, the whole configuration example of a nonvolatile semiconductor memory device according to the comparative example will be described. In this example, a NAND flash memory is exemplified as the nonvolatile semiconductor memory device.

As illustrated, a NAND flash memory 100 according to the comparative example is provided with a memory cell array 111 and an input buffer 112.

In the comparative example, the input buffer 112 is to amplify the control signal or a data signal input from the outside with "0"/"1" of a CMOS level, and adopts an inverter type circuit configuration.

To the input buffer 112, an external input signal such as the control signal or the data signal is input from the input terminal TE11 of the outside of the device (chip) through a pad PA11. The input buffer 112 is composed of a plurality of inverters INV11 and INV12 of a first stage or multiple stages, and amplifies the input signal with "0"/"1" of the CMOS level to output the amplified signal as a buffer output signal.

In this case, the first stage inverter INV11 that directly receives the input signal exerts an influence upon the timing margin such as a setup/hold time, the voltage characteristics such as VIH/VIL, and is considered as a very important circuit.

Configuration Example of the First Stage Inverter INV11

Figure 22:
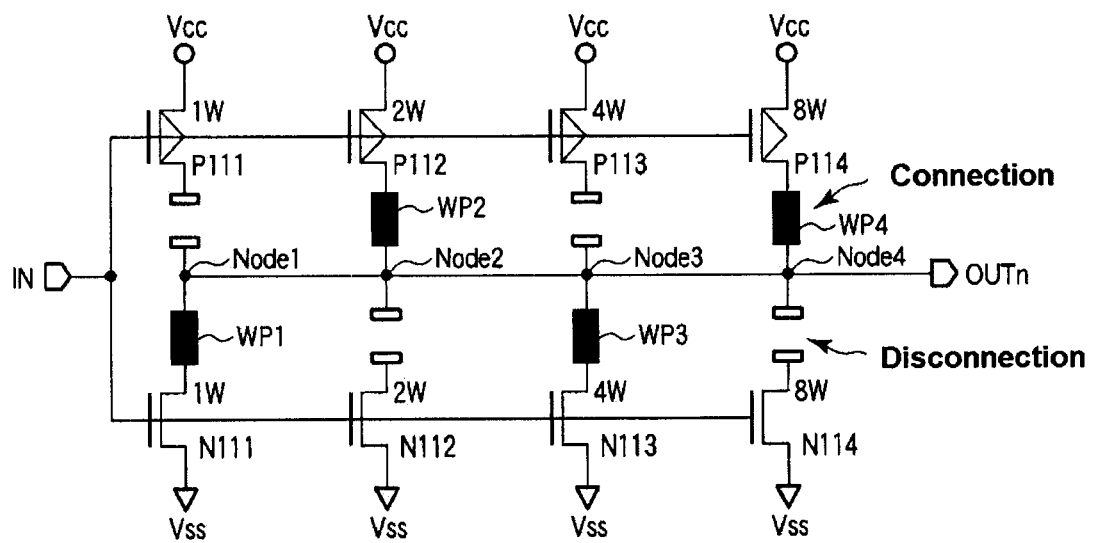
FIG. 22 is an equivalent circuit diagram illustrating a configuration example of an inverter provided in an input buffer according to the comparative example of the invention.
Figure 23:
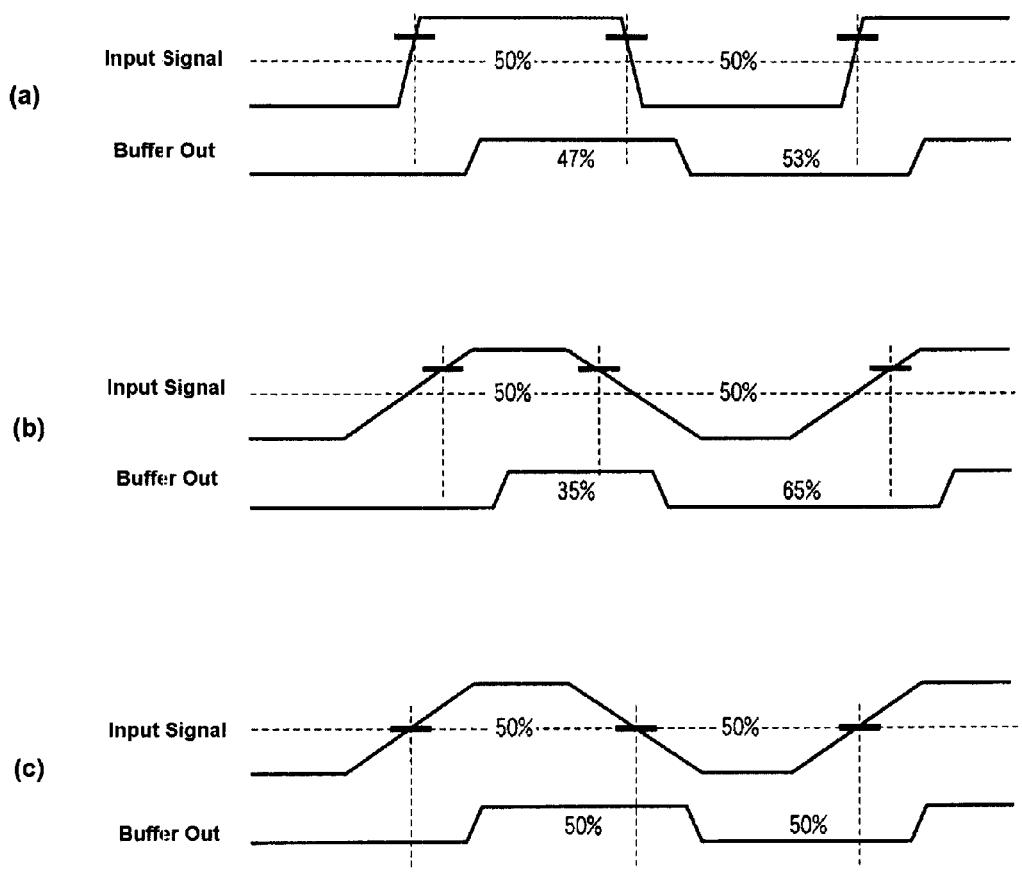
FIGS. 23A to 23C are timing charts illustrating an output operation of an input buffer according to the comparative example of the invention.
Figure 24:
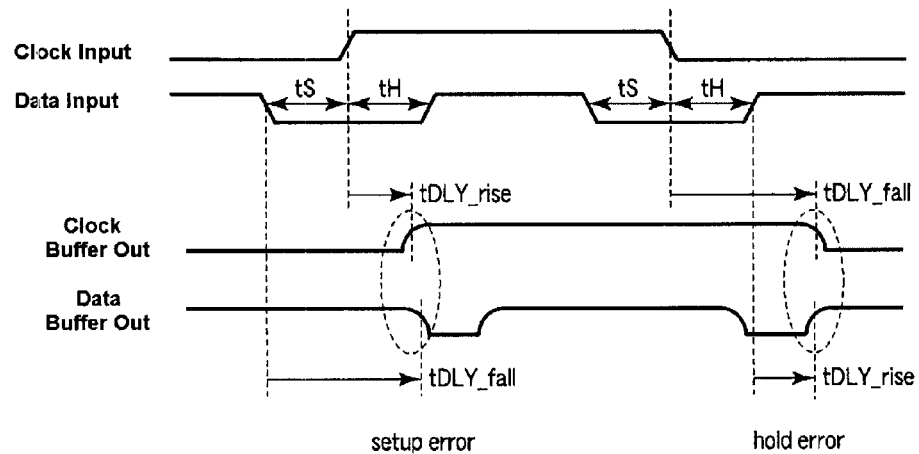
FIGS. 24A and 24B are timing charts illustrating a setup error and a hold error due to a duty error of an input buffer according to the comparative example of the invention.
Figure 24:
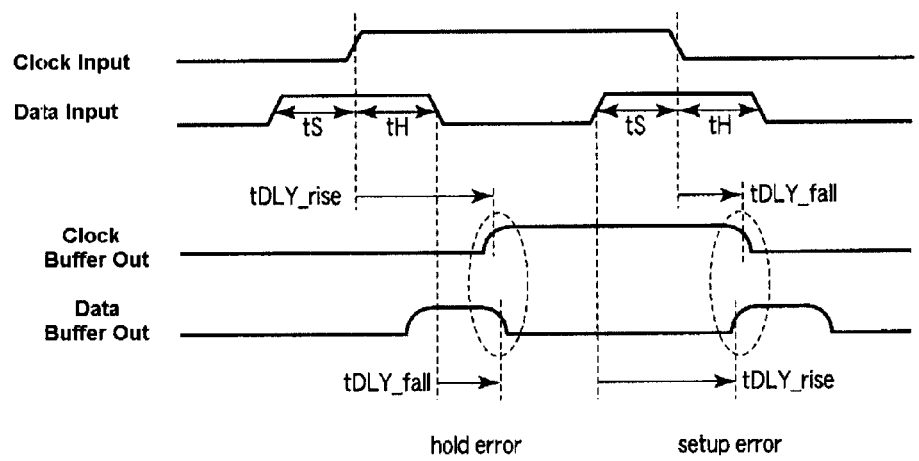

Next, referring to FIG. 22, the configuration example of the first stage inverter INV11 according to the comparative example will be described in detail.

As illustrated, according to the circuit configuration of the inverter INV11, both sides of PMOS transistors P111 to P114 and NMOS transistors N111 to N114 are divided into gate widths (W) of 1 W to 8 W (1, 2, 4, 8). Further, through the connection/disconnection of the divided transistors P111 to P114 and N111 to N114, output nodes Node1 to Node4 are connected or disconnected. Accordingly, by replacing the interconnection layer mask, the ratio of W of the inverter transistors P111 to P114 and NMOS transistors N111 to N114 is changed, and thus the circuit threshold value of the inverter INV11 can be adjusted.

For example, in this example, interconnection layer masks WP1 to WP4 are connected to the respective output nodes Node1 to Node4. Accordingly, they are connected so that the gate width of the PMOS transistor becomes 8 W+2 W=10 W and the gate width of the NMOS transistor becomes 4 W+1 W=5 W. As a result, the ratio of W becomes 2:1 (this is called β ratio=2).

As described above, the β ratio is defined by the ratio of channel width (W) of the PMOS transistor and the NMOS transistor.

Typically, this β ratio is adjusted so that the circuit threshold value of the inverter becomes an intermediate electric potential between the VIH and VIL of the input. Since it is defined that the VIH is a voltage that is lowered for about 0.2V from the power supply voltage VccQ, and the VIL is about 0.2V, the intermediate voltage between VIH and VIL becomes ½ of VccQ. By this circuit configuration, it is possible to make the circuit threshold value of the input buffer 112 closer to ½ of VccQ.

However, according to this circuit configuration and the method of correcting the circuit threshold value, the β ratio of the PMOS transistors P111 to P114 and the NMOS transistors N111 to N114 is determined by the interconnection layer mask. Accordingly, the adjustment of the β ratio is limited, and thus it is difficult to cope with the difference between the threshold values of the transistors for each device or the change of the power supply voltage. With respect to the problems in the case where the circuit threshold value of the input buffer 112 deviates from ½ of VccQ, explanation will be made with reference to FIGS. 23A to 23C and 24A and 24B.

Buffer Output Operation of Input Buffer 112

Referring to FIGS. 23A to 23C, the buffer output operation of the input buffer 112 according to the comparative example will be described.

FIG. 23A illustrates the operation example in the case where the circuit threshold value of the input buffer 112 is higher than ½ of VccQ. Since the output of the inverter INV11 that constitutes the input buffer 112 starts the shifting from the moment when the input crosses the circuit threshold value, if the circuit threshold value has a high electric potential, the delay from the rising of the input becomes large, and the delay from the falling becomes small. As a result, the output duty against the input duty of 50% becomes 47%/53%, and the duty error of about 3% occurs.

As described above, the duty error is defined as a deviation (difference) of the duty ratio of the output against the duty ratio of the input. The duty ratio is defined as a time ration between an "H"-level period and an "L"-level period.

FIG. 23B illustrates the operation example in the case where the circuit threshold value of the input buffer 112 is high and the slew rate of the input is small (the slope is easy). As illustrated, if the slew rate of the input is small even in the case where the circuit threshold values are the same, it can be seen that the duty error is extended to about 15%.

Here, the slew rate is defined as a voltage of the input signal that is change in a unit time, and is defined as a value of about 1V/ns. However, the recent NAND flash memory or the like is often provided in the form of so called a stack chip in which a memory controller chip and a plurality of NAND chips are packaged. Accordingly, the load capacity from the viewpoint of the memory controller is large, and the slew rate of the control signal or data signal being supplied is disposed to become smaller than the prescribed slew rate as illustrated in this example.

FIG. 23C illustrates the operation in the case where the circuit threshold value of the input buffer 112 is adjusted to ½ of VccQ. As illustrated, if the circuit threshold value corresponds to the accurate intermediate electric potential, the output duty is continuously maintained 50% regardless of the slew rate of the input.

Regarding a Setup Error and a Hold Error Due to a Duty Error

Next, with reference to FIGS. 24A and 24B, a setup error and a hold error due to a duty error of an input buffer 112 according to this comparative example will be described.

Here, it is very important in securing the operation margin of the circuit to maintain the output duty of the input buffer 112 50%. For example, according to the recent NAND flash memory, in order to increase the throughput of the data input/output, the cycle time of the serial data input/output has been shortened, and DDR (Double Data Rate) type interface has been adopted.

In the DDR type, in order to exchange data on both sides of the rising edge and the falling edge, for example, if the duty of the RE (Read Enable) input buffer falls down during reading, the window blurring of the output data occurs, and thus the margin of the setup time/hold time of the data on the controller side is reduced. At the worst case, the data may not be accurately input.

Further, even in the NAND flash memory, the duty error exerts a great influence upon the margin of the setup time/hold time during the data reception.

For example, as illustrated in FIGS. 24A and 24B, the increase of the duty error of the input buffer 112 and the falling-down of the duty mean that there is a difference in delay time until the input buffer 112 produces its output when the input rises and falls. At this time, in this example, data is input at a setup time tS and at a hold time tH with respect to the rising edge and the falling edge of the clock input.

FIG. 24A illustrates a case where the falling delay is larger (rising delay<falling delay). As illustrated, since the falling delay tDLY_fall is larger than the rising delay tDLY_rise, the falling of the data buffer output becomes late to generate a setup error, and the falling of the clock buffer output becomes late to generate a hold error.

FIG. 24B illustrates a case where the rising delay is larger (falling delay<rising delay). As illustrated, since the rising delay tDLY_rise is larger than the falling delay tDLY_fall, the rising of the clock buffer output becomes late to generate a hold error, and the rising of the data buffer output becomes late to generate a setup error.

Here, in the next-generation NAND flash memory on which the proposed high-speed interface is mounted, it is expected that the cycle time of the serial data input/output is, for example, of a DDR type of about 15 ns, and the data setup/hold timing prescription is about 1.5 ns. Accordingly, it may be impossible to receive data accurately in the input buffer in which the difference between the rising delay and the falling delay is over 1.5 ns.

If it is possible to make the circuit threshold value of the input buffer constantly coincide with ½ of VccQ, the rising delay and the falling delay can be made to be equal to each other. In this case, the setup/hold time of the input supplied from the outside of the chip can be maintained even within the chip, and thus the margin can be secured at maximum.

However, in the circuit configuration of the input buffer 112 in which the interconnection layer mask adjust the circuit threshold value according to the comparative example, the adjustment of the β ratio is limited, it may be impossible to cope with the difference between the transistor threshold values for each chip or the power supply voltage, and this causes an important factor that deteriorates the performance in the data input.

As described above in the comparative example, the duty error of the input buffer 112 becomes a big obstacle on the performance improvement of the nonvolatile semiconductor memory device such as a next-generation NAND flash memory and so on. In order to correct this, it may be considered to appropriately correcting the β ratio of the input buffer 112 by replacing the interconnection layer option, but it may not be possible to cope with the individual factors such as the different between the transistor threshold values, used power supply voltage, and the like.

Accordingly, in the configuration and the correction method according to the comparative example, deterioration of a setup/hold margin due to the duty error generated by individual factors or the difference between the output data windows occurs, and thus the performance of the nonvolatile semiconductor memory device is greatly deteriorated.

Modified Examples of the Embodiments

Also, the above embodiments and the modified examples include the following aspects.

(1) A nonvolatile semiconductor memory device includes an input buffer provided with a first inverter that can electrically adjust circuit threshold values; a circuit threshold value monitor provided with a second inverter having the same circuit configuration as the first inverter to detect the circuit threshold values of the first inverter when input and output of the second inverter are short-circuited, respectively; a memory storing parameter values that correspond to the circuit threshold values detected by the circuit threshold value monitor; and a data-reader circuit reading the parameter values given to the first inverter from the memory.

(2) The nonvolatile semiconductor memory device of (1) further includes a comparator comparing an output of the circuit threshold value monitor with a reference electric potential and outputting a count stop signal when the compared values correspond to each other; a counter circuit performing a count operation until the count stop signal is input and sequentially generating the parameter values; and a data-writer circuit writing the parameter values in the memory.

(3) The nonvolatile semiconductor memory device of (2) further includes a shift circuit performing fine adjustment of the parameter values; a selector switching and outputting an output of the counter circuit and an output of the shift circuit; and a storage circuit outputting an output of the selector to the data-writer circuit, the circuit threshold value monitor, and the input buffer.

(4) In the nonvolatile semiconductor memory device of (1) to (3), the input buffer further includes a third inverter which is provided on the next stage of the first inverter and has the same circuit configuration as the first inverter.

(5) In the nonvolatile semiconductor memory device of (4), the input buffer is arranged on the outputs of the first and third buffers, and further includes means, arranged on outputs of the first and third inverters, for adjusting slopes of the outputs of the first and third inverters.

(6) A method of correcting a circuit threshold value of a nonvolatile semiconductor memory device includes the steps of sequentially inputting trim values as comparing an output of a circuit threshold value monitor and a voltage value of a power supply voltage; determining a trim value, for which the output of the circuit threshold value monitor most approaches the voltage value, as a parameter value; and storing the determined parameter value in a memory.

(7) The method of correcting a circuit threshold value of (6) further includes the step of reading the stored parameter value and loading the read parameter value in a storage circuit.

(8) The method of correcting a circuit threshold value of (7) further includes the step of supplying the loaded parameter value as the circuit threshold value of a first inverter of an input value.

(9) The method of correcting a circuit threshold value of (6) is performed during a test process of the nonvolatile semiconductor memory device.

(10) The method of correcting a circuit threshold value of (8) or (9) is performed during a power-on process of the nonvolatile semiconductor memory device.

Although the present invention has been explained using the first to fifth embodiments, modified example, and comparative example as described above, the present invention is not limited to the above-described embodiments, modified example, and comparative example, and in practical applications, various modifications are possible, without departing from the scope of the invention. Further, the above-described embodiments, modified examples, and comparative examples can include the invention of various steps, and thus various inventions can be extracted through an appropriate combination of plural configuration conditions as described above. For example, even though some configuration conditions are left out of the whole configuration conditions as indicated in the embodiments, at least one of the above-described technical subjects can be solved. Also, in the case where at least one of the above-described effects can be obtained, the configuration from which the corresponding configuration condition is left out can be extracted as the invention.

What is claimed is:

1. A nonvolatile semiconductor memory device comprising:
    an input buffer provided with a first inverter that can electrically adjust circuit threshold values;
    a circuit threshold value monitor provided with a second inverter having the same circuit configuration as the first inverter to detect the circuit threshold values of the first inverter when input and output of the second inverter are short-circuited, respectively;
    a memory storing parameter values that correspond to the circuit threshold values detected by the circuit threshold value monitor; and
    a data-reader circuit reading the parameter values given to the first inverter from the memory.

2. The nonvolatile semiconductor memory device according to claim 1, further comprising:
    a comparator comparing an output of the circuit threshold value monitor with a reference electric potential and outputting a count stop signal when the compared values correspond to each other;
    a counter circuit performing a count operation until the count stop signal is input and sequentially generating the parameter values; and
    a data-writer circuit writing the parameter values in the memory.

3. The nonvolatile semiconductor memory device according to claim 2, further comprising:
    a shift circuit performing fine adjustment of the parameter values;
    a selector switching and outputting an output of the counter circuit and an output of the shift circuit; and
    a storage circuit outputting an output of the selector to the data-writer circuit, the circuit threshold value monitor, and the input buffer.

4. The nonvolatile semiconductor memory device according to claim 3, wherein the input buffer further includes a third inverter which is provided on the next stage of the first inverter and has the same circuit configuration as the first inverter.

5. The nonvolatile semiconductor memory device according to claim 4, wherein the input buffer further includes means, arranged on outputs of the first and third inverters, for adjusting slopes of the outputs of the first and third inverters.

6. The nonvolatile semiconductor memory device according to claim 2, wherein the input buffer further includes a third inverter which is provided on the next stage of the first inverter and has the same circuit configuration as the first inverter.

7. The nonvolatile semiconductor memory device according to claim 6, wherein the input buffer further includes means, arranged on outputs of the first and third inverters, for adjusting slopes of the outputs of the first and third inverters.

8. The nonvolatile semiconductor memory device according to claim 1, wherein the input buffer further includes a third inverter which is provided on the next stage of the first inverter and has the same circuit configuration as the first inverter.

9. The nonvolatile semiconductor memory device according to claim 8, wherein the input buffer further includes means, arranged on outputs of the first and third inverters, for adjusting slopes of the outputs of the first and third inverters.

* * * * *